(12) United States Patent
Hatakeyama et al.

(10) Patent No.: US 7,232,638 B2
(45) Date of Patent: *Jun. 19, 2007

(54) RESIST COMPOSITION AND PATTERNING PROCESS

(75) Inventors: Jun Hatakeyama, Niigata-ken (JP); Hideshi Kurihara, Tokyo (JP); Takanobu Takeda, Niigata-ken (JP); Osamu Watanabe, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 137 days.

This patent is subject to a terminal disclaimer.

(21) Appl. No.: 10/427,939

(22) Filed: May 2, 2003

(65) Prior Publication Data

US 2003/0224291 A1 Dec. 4, 2003

(30) Foreign Application Priority Data

May 2, 2002 (JP) .............................. 2002-130326

(51) Int. Cl.
*G03F 7/004* (2006.01)

(52) U.S. Cl. .................. 430/270.1; 430/330; 430/311; 430/313

(58) Field of Classification Search ............. 430/270.1, 430/330, 311, 313
See application file for complete search history.

(56) References Cited

U.S. PATENT DOCUMENTS

| | | | |
|---|---|---|---|
| 3,478,043 A * | 11/1969 | Arnold et al. ........... 546/281.7 |
| 4,491,628 A | 1/1985 | Ito et al. |
| 5,310,619 A | 5/1994 | Crivello et al. |
| 6,028,154 A * | 2/2000 | Schaedeli et al. ............ 526/266 |
| 6,042,989 A * | 3/2000 | Schaedeli et al. ......... 430/270.1 |
| 6,165,678 A * | 12/2000 | Allen et al. ............... 430/270.1 |
| 6,177,228 B1 * | 1/2001 | Allen et al. ............... 430/270.1 |
| 6,492,089 B2 * | 12/2002 | Hatakeyama et al. .... 430/270.1 |
| 6,555,289 B2 * | 4/2003 | Sasaki et al. ............ 430/270.1 |
| 6,589,707 B2 * | 7/2003 | Lee et al. ................. 430/270.1 |
| 6,639,035 B1 * | 10/2003 | Chen et al. ................. 526/266 |
| 6,677,100 B2 * | 1/2004 | Kim et al. ............... 430/270.1 |
| 6,680,389 B2 * | 1/2004 | Harada et al. .............. 549/313 |
| 6,790,591 B2 * | 9/2004 | Harada et al. ........... 430/270.1 |
| 6,866,983 B2 * | 3/2005 | Hatakeyama et al. .... 430/270.1 |
| 6,916,543 B2 * | 7/2005 | De et al. ..................... 428/447 |

(Continued)

FOREIGN PATENT DOCUMENTS

EP         1096319 A1 *   5/2001

(Continued)

OTHER PUBLICATIONS

English language abstract of JP 2002-091005.*

(Continued)

*Primary Examiner*—Amanda Walke
(74) *Attorney, Agent, or Firm*—Birch, Stewart, Kolasch & Birch, LLP

(57) ABSTRACT

Chemically amplified positive resist compositions comprising a polymer obtained by copolymerizing a silicon-containing monomer with a polar monomer having a value of LogP or cLogP of up to 0.6 and optionally hydroxystyrene, a photoacid generator and an organic solvent are sensitive to high-energy radiation and have a high sensitivity and resolution at a wavelength of less than 300 nm and improved resistance to oxygen plasma etching.

18 Claims, 2 Drawing Sheets

U.S. PATENT DOCUMENTS

| | | | |
|---|---|---|---|
| 6,919,161 B2 * | 7/2005 | Hatakeyama et al. | 430/270.1 |
| 6,929,897 B2 * | 8/2005 | Foster et al. | 430/270.1 |
| 2002/0132182 A1 * | 9/2002 | Nishi et al. | 430/270.1 |
| 2004/0068124 A1 * | 4/2004 | Hasegawa et al. | 549/397 |

FOREIGN PATENT DOCUMENTS

| | | | |
|---|---|---|---|
| JP | 63-27829 A | | 2/1988 |
| JP | 2-27660 B2 | | 6/1990 |
| JP | 5-158239 A | | 6/1993 |
| JP | 5-232706 A | | 9/1993 |
| JP | 5-249662 A | | 9/1993 |
| JP | 5-249683 A | | 9/1993 |
| JP | 5-257282 A | | 10/1993 |
| JP | 5-289322 A | | 11/1993 |
| JP | 5-289340 A | | 11/1993 |
| JP | 6-118651 A | | 4/1994 |
| JP | 9-73173 A | | 3/1997 |
| JP | 9-110938 A | | 4/1997 |
| JP | 9-230595 A | | 9/1997 |
| JP | 10-10739 A | | 1/1998 |
| JP | 10-324748 A | | 12/1998 |
| JP | 11060734 A | * | 3/1999 |
| JP | 11-302382 A | | 11/1999 |
| JP | 2001-158808 A | | 6/2001 |
| JP | 2001-278918 A | | 10/2001 |
| JP | 2001278918 A | * | 10/2001 |
| JP | 2002-55456 A | | 2/2002 |
| JP | 2002091005 A | * | 3/2002 |
| JP | 2002327013 A | * | 11/2002 |
| JP | 2003261529 A | * | 9/2003 |
| WO | WO 97/33198 | | 9/1997 |

OTHER PUBLICATIONS

International Work Shop 157nm Lithography MIT-LL, Boston, MA, May 5, 1999.
J. Vac. Sci. Technol. B17(6), Nov./Dec. 1999, pp. 3267-3272.
Journal of Photopolymer Science and Technology, Nov. 4, 2000, vol. 13, No. 3 & 4, pp. 451-458 and 657-664.
W. Brunsvold et al, SPIE vol. 1925, (1993), pp. 377-387.
J. Hatakeyama et al, SPIE vol. 3333, (1998), pp. 62-72.
Journal of Photopolymer Science and Technology, Nov. 3, 1996, vol. 9, No. 3, pp. 435-446.
C. R. Kessel et al, SPIE vol. 3678, (1999), pp. 214-220, 241-250, 562-572.
J. Kim et al, SPIE vol. 3678, (1999), pp. 420-428.

* cited by examiner

RESIST COMPOSITION AND PATTERNING PROCESS

This invention relates to chemically amplified positive resist compositions used for micropatterning in a process for the fabrication of semiconductor devices or the like. More particularly, it relates to chemically amplified positive resist compositions adapted for exposure to high-energy radiation such as deep-UV, KrF excimer laser light (248 nm), ArF excimer laser light (193 nm), $F_2$ laser light (157 nm), electron beams or x-rays, and a process for forming a pattern.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF excimer laser (248 nm) brought about a significant innovation, contributing to the mass-scale production of 0.25 micron rule and subsequent devices. To the demand for a resist material with a higher resolution and sensitivity, acid-catalyzed chemical amplification positive working resist materials are effective as disclosed in U.S. Pat. Nos. 4,491,628 and 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, passed through the 0.25 micron rule, and currently entered the mass production phase on the 0.18 micron rule. Engineers have attempted test fabrication on the 0.15 micron rule and started investigation on the 0.13 micron rule, with the trend toward a finer pattern rule being accelerated. A wavelength change-over from KrF to shorter wavelength ArF excimer laser (193 nm) is expected to enable miniaturization of the design rule to 0.13 µm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser (157 nm) which is expected to enable further miniaturization to 0.10 µm or less, more difficulty arises in insuring transparency because it was found that acrylic resins are not transmissive to light at all and those cycloolefin resins having carbonyl bonds have strong absorption. Polymers having benzene rings have a somewhat improved transmittance in proximity to 160 nm wavelength, which is far below the practically acceptable level. It was found that in single layer resists, reducing carbon-to-carbon double bonds as typified by benzene rings and carbon-to-oxygen double bonds as typified by carbonyl groups is essential for insuring a light transmittance (see International Work Shop 157 nm Lithography MIT-LL, Boston, Mass., May 5, 1999). It was reported in J. Vac. Sci. Technol., B17(6), November/December 1999 that introduction of fluorine is effective to improve transmittance. A number of fluorinated polymers for resist compositions were proposed in J. Photopolymer Sci. and Technol., Vol. 13, No. 4 (2000), pp. 657-664 and pp. 451-458. However, the transmittance of these polymers does not reach that of polyhydroxystyrene and derivatives thereof adapted for KrF exposure and poly(meth)acrylic derivatives and polycycloolefin derivatives adapted for ArF exposure.

As is known in the art, the bi-layer resist method is advantageous in forming a high-aspect ratio pattern on a stepped substrate. It is also known that in order that a two-layer resist film be developable with a common alkaline developer, high molecular weight silicone compounds having hydrophilic groups such as hydroxyl and carboxyl groups must be used.

Among silicone base chemically amplified positive resist compositions, recently proposed were those compositions for KrF laser exposure comprising a base resin in the form of polyhydroxybenzylsilsesquioxane, which is a stable alkali-soluble silicone polymer, in which some phenolic hydroxyl groups are blocked with t-BOC groups, in combination with a photoacid generator (see JP-A 6-118651 and SPIE vol. 1925 (1993), p. 377). Positive resist compositions comprising as a base a silsesquioxane of the type in which cyclohexylcarboxylic acid is substituted with an acid labile group were proposed for ArF laser exposure (see JP-A 10-324748, JP-A 11-302382, and SPIE vol. 3333 (1998), p. 62). Positive resist compositions comprising a silsesquioxane having hexafluoroisopropanol as a dissolvable group as a base were proposed for $F_2$ laser exposure (see JP-A 2002-55456). The above polymer bears in its backbone a polysilsesquioxane containing a ladder skeleton produced through polycondensation of a trialkoxysilane or trihalosilane.

Silicon-containing (meth)acrylates were proposed as a resist base polymer having silicon pendants (see JP-A 9-110938, J. Photopolymer Sci. and Technol., Vol. 9, No. 3 (1996), pp. 435-446).

The silicon-containing polymer of the (meth)acrylate type has the drawback that its resistance to dry etching with oxygen plasma is weak as compared with the silsesquioxane polymer. A low silicon content and a different polymer main skeleton account for this weak dry etching resistance. The (meth)acrylate of siloxane pendant type also has the drawback of poor developer wetting that it is likely to repel a developer solution. SPIE vol. 3678 (1999), pp. 214, 241 and 562 describes a polymer comprising (meth)acrylate of the trisilane or tetrasilane pendant type having an increased silicon content and a silicon-containing substituent which can be eliminated with acid so that the polymer is improved in alkali dissolution. Despite absorption at a wavelength of less than 200 nm due to silicon-to-silicon bonds, this polymer is so transparent relative to KrF excimer laser beams of 248 nm that it is a useful polymer having a silicon-containing acid-eliminatable group and improved etching resistance. Besides, silicon-containing acid labile groups other than the foregoing have been investigated as reported in SPIE vol. 3678 (1999), p. 420.

The applicant/assignee proposed novel acid labile groups having silicon introduced therein in JP-A 2001-278918 and JP-A 2001-158808 (U.S. Pat. No. 6,492,089). These polymers have the advantages of an improved acid elimination ability and prevention of T-top profiling as well as the advantageous feature that they are fully transparent at the wavelength of ArF excimer laser because of the inclusion of a carbon atom between silicon atoms and the exclusion of a silicon-to-silicon bond.

Drawbacks of the silicon-containing resist compositions include poor line edge roughness and the generation of scum on substrates. Silicon-containing groups, especially alkyl-substituted silyl groups are extremely hydrophobic so that they interfere with development with alkaline water and incur swelling. As a result, the line edge roughness is exaggerated, and residues following dissolution become scum on the substrate or resist pattern.

SUMMARY OF THE INVENTION

An object of the invention is to provide a resist composition, especially a chemically amplified positive resist composition, featuring a high sensitivity, a high resolution, minimized line edge roughness despite an increased silicon content, and no generation of residues, and especially suitable as a material for use in the two-layer resist method adapted to form a high-aspect ratio pattern. Another object of the invention is to provide a process for forming a resist pattern using the same.

We have found that a polymer obtained by copolymerization of a silicon-containing monomer with a polar monomer having a LogP or cLogP value of up to 0.6 is useful as a base polymer for formulating such a resist composition.

In one aspect, the invention provides a resist composition comprising as a base resin a polymer obtained by copolymerization of a silicon-containing monomer with a polar monomer having a LogP or cLogP value of up to 0.6. The polymer may further have hydroxystyrene copolymerized therewith.

In a preferred embodiment, the polar monomer has a structure of the general formula (1) or (2).

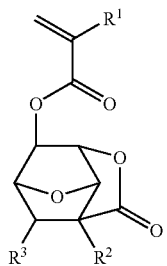
(1)

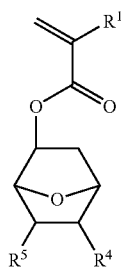
(2)

Herein $R^1$ which may be the same or different is hydrogen, methyl or cyano group, $R^2$ is hydrogen, methyl or cyano group, $R^3$ is hydrogen or ester group, $R^4$ and $R^5$ each are hydrogen, ester group or lactone ring-containing group, or $R^4$ and $R^5$, taken together, may form a ring with the carbon atoms to which they are attached, which ring may contain an ether, ester, carbonate or carboxylic anhydride as a partial structure.

Preferably, recurring units derived from the silicon-containing monomer have the general formula (3).

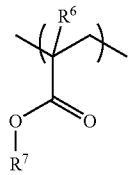
(3)

Herein $R^6$ is hydrogen or methyl and $R^7$ is a silicon-containing group selected from the general formulae (4) to (9).

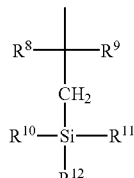
(4)

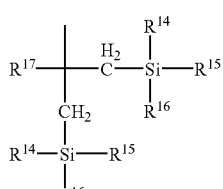
(5)

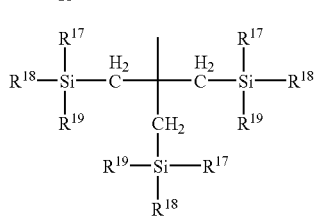
(6)

In formulae (4), (5) and (6), $R^8$, $R^9$ and $R^{13}$ each are hydrogen or a straight, branched or cyclic $C_{1-10}$ alkyl group, or $R^8$ and $R^9$, taken together, may form an aliphatic carbon ring of 3 to 8 carbon atoms with the carbon atom to which they are attached, $R^{10}$, $R^{11}$, $R^{12}$, $R^{13}$, $R^{14}$, $R^{15}$, $R^{16}$, $R^{17}$, $R^{18}$ and $R^{19}$ each are a straight, branched or cyclic $C_{1-10}$ alkyl group, a $C_{6-10}$ aryl group, a trialkylsilyl group, a trialkylsiloxy group or a group of the following formula:

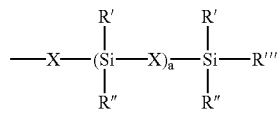

wherein X is a single bond, oxygen atom or $C_{1-6}$ alkylene group, "a" is an integer of 1 to 10, R', R" and R'" each are a straight, branched or cyclic $C_{1-10}$ alkyl group or trialkylsilyl group, two of $R^{10}$, $R^{11}$ and $R^{12}$ two of $R^{14}$, $R^{15}$ and $R^{16}$, and two of $R^{17}$, $R^{18}$ and $R^{19}$ may bond together to form a ring of the following formula with the silicon atom to which they are attached,

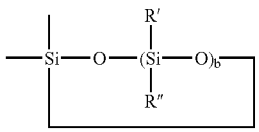

wherein R' and R" are as defined above, and b is an integer of 2 to 9.

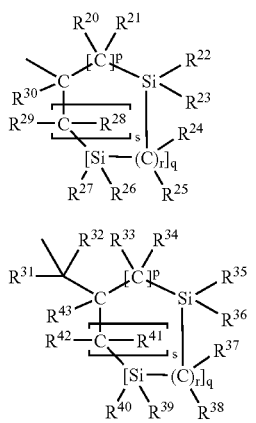

In formulae (7) and (8), $R^{30}$, $R^{31}$ and $R^{32}$ each are a straight, branched or cyclic $C_{1-20}$ alkyl group, $R^{20}$, $R^{21}$, $R^{24}$, $R^{25}$, $R^{28}$, $R^{29}$, $R^{33}$, $R^{34}$, $R^{37}$, $R^{38}$, $R^{41}$ and $R^{42}$ each are hydrogen or a straight, branched or cyclic $C_{1-20}$ alkyl group, $R^{22}$, $R^{23}$, $R^{26}$, $R^{27}$, $R^{35}$, $R^{36}$, $R^{39}$ and $R^{40}$ each are hydrogen, a straight, branched or cyclic $C_{1-20}$ alkyl group, fluorinated $C_{1-20}$ alkyl group, or $C_{6-20}$ aryl group, p, q, r and s each are an integer of 0 to 10, and $1 \leq p+q+s \leq 20$.

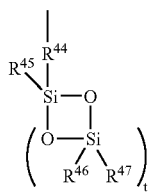

In formula (9), $R^{44}$ is a $C_{24}$ alkylene group, $R^{45}$, $R^{46}$ and $R^{47}$ each are a straight, branched or cyclic $C_{1-10}$, alkyl group or $C_{6-10}$ aryl group, and t is an integer of 2 to 10.

A preferred embodiment of the invention is a chemically amplified positive resist composition comprising (A) the polymer as set forth above, (B) a photoacid generator, and (C) an organic solvent. The composition optionally includes (D) a dissolution inhibitor or (E) a basic compound or both.

In another aspect, the invention provides a process for forming a resist pattern comprising the steps of applying the resist composition defined above onto a substrate to form a coating; heat treating the coating and then exposing it to high-energy radiation having a wavelength of up to 300 nm or electron beam through a photomask; and optionally heat treating the exposed coating and developing it with a developer.

The pattern forming process is effective when the substrate bears thereon an underlay on which the coating of the resist composition is formed. In a preferred embodiment, the process further includes the step of treating the underlay by an etching process including oxygen plasma etching, after the resist pattern formation. In another preferred embodiment, the process further includes the step of treating the underlay by etching with a halogen gas containing chlorine or bromine, after the resist pattern formation.

DESCRIPTION OF THE PREFERRED EMBODIMENTS

Polymer

Figure 1A:
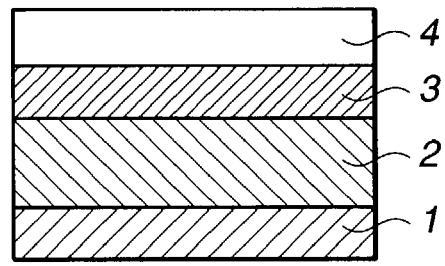
FIG. 1 schematically illustrates a layer structure patterning process involving oxygen etching.

The resist composition of the invention is defined as comprising a polymer or high molecular weight compound obtained by copolymerizing a silicon-containing monomer with a polar monomer having a LogP or cLogP value of up to 0.6 and an optional monomer such as hydroxystyrene.

The polar monomer is herein described in terms of LogP or cLogP. LogP, a partition coefficient of n-octanol/water is used as a solubility parameter of a given material. It is a ratio in maximum dissolution concentration of octanol to water. Professor Hansch at Pomona College first announced that LogP is a crucial parameter for pharmaceuticals. Since then, LogP values of numerous materials have been measured.

On the other hand, cLogP for calculating LogP from a chemical structural formula using a substituent constant π was developed by Dr. Leo who studied with Professor Hansch. The software of cLogP is commercially available from Daylight Chemical Information Systems, Inc. The cLogP is known as a convenient method for prediction of LogP values through calculations.

In the polymer consisting of recurring units of plural types according to the invention, recurring units of one type are provided by units derived from a monomer having a LogP or cLogP value of up to 0.6, preferably up to 0.55, more preferably up to 0.5, most preferably up to 0.45. If a monomer having a LogP or cLogP value of more than 0.6 is used, the resulting polymer becomes less hydrophilic and fails to achieve the objects of the invention. LogP may be 0, and cLogP may be 0 or minus values.

Typical polar monomers are of the general formula (1) or (2) below.

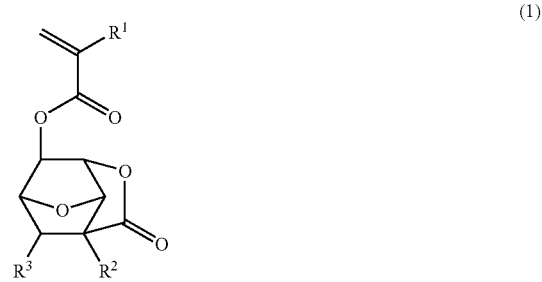

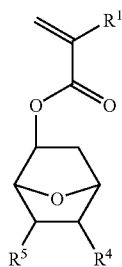

(2)

Herein $R^1$ which may be the same or different is a hydrogen atom, methyl group or cyano group. $R^2$ is a hydrogen atom, methyl group or cyano group. $R^3$ is a hydrogen atom or ester group. Each of $R^4$ and $R^5$ is a hydrogen atom, ester group or lactone ring-containing group. $R^4$ and $R^5$, taken together, may form a ring with the carbon atoms to which they are attached, which ring may contain an ether, ester, carbonate or carboxylic anhydride as a partial structure.

Suitable ester groups include methyl ester and ethyl ester. Suitable lactone ring-containing groups include γ-butyrolactone and β-butyrolactone. Where $R^4$ and $R^5$ bond together to form a ring with the carbon atoms to which they are attached, the total number of carbon atoms in $R^4$ and $R^5$ is preferably from 1 to 8, more preferably from 2 to 6. In this event, the ring may contain an ether (—O—), ester (—COO—), carbonate (—OC(=O)O—) or carboxylic anhydride (—(C=O)—O—(C=O)—).

Illustrative examples of the hydrophilic groups represented by formula (1) or (2) are given below. It is noted that the monomers shown below are characterized by their origin from compounds containing a 7-oxonorbornane skeleton produced by Diels-Alder reaction with furan.

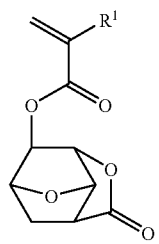

(1)-1

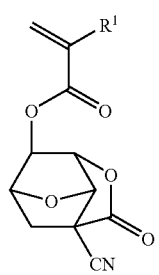

(1)-2

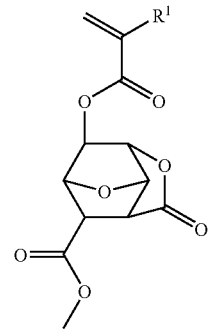

(1)-3

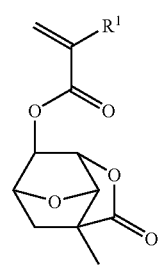

(1)-4

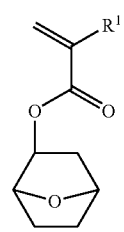

(2)-1

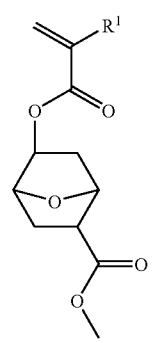

(2)-2

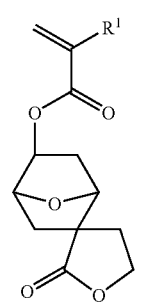

(2)-3

-continued (2)-4
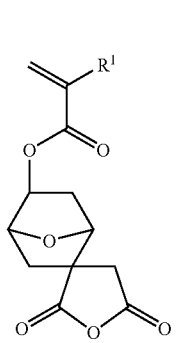

(2)-5
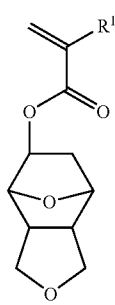

(2)-6
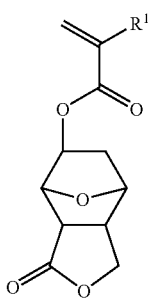

Unlike norbornane, 7-oxonorbornane has very high hydrophilicity. Presumably, on account of steric strain exerted at the 7-position corresponding to the bridgehead, the lone pair of the oxygen atom is oriented outward of the ring to enhance polarity whereby hydrophilicity is enhanced.

Shown below are the results of calculation using the software pcmodels, version 4.7.2, by Daylight Chemical Information Systems, Inc.

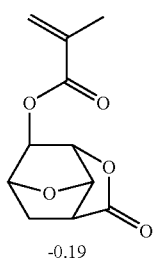
−0.19

-continued

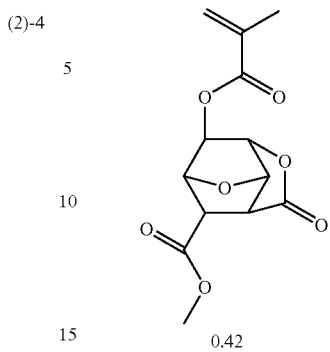
0.42

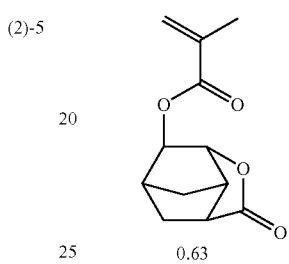
0.63

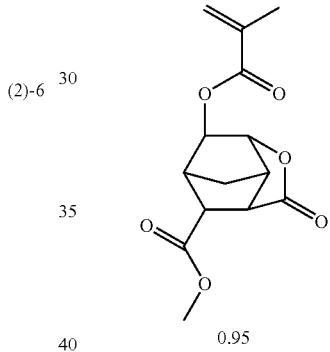
0.95

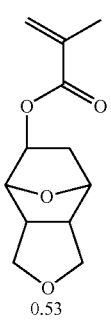
0.53

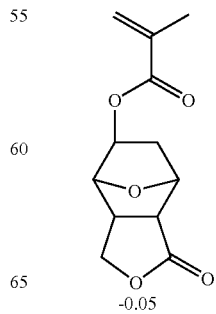
−0.05

-continued

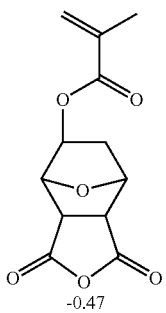
-0.47

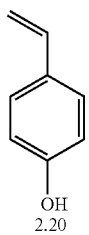
2.20

Those compounds having 7-oxonorbornane skeleton have very low cLogP values (negative in some cases) as compared with other compounds, indicating high hydrophilicity.

The hydrophilic group of the polar monomer to be copolymerized in the polymer used in the inventive resist composition has very high hydrophilicity, a high solubility in alkaline water and an enhanced effect of preventing swelling.

Next, the silicon-containing monomer is preferably one that provides recurring units of the following formula (3).

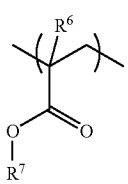
(3)

Herein $R^6$ is a hydrogen atom or methyl and $R^7$ is a silicon-containing group. The silicon-containing group is preferably selected from the general formulae (4) to (9) shown below.

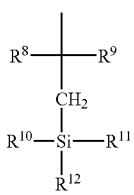
(4)

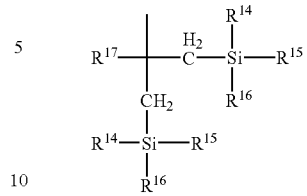
(5)

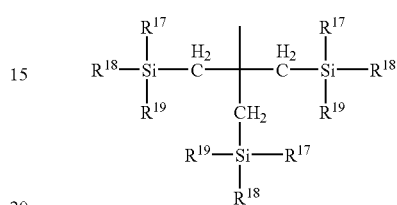
(6)

Herein $R^8$, $R^9$ and $R^{13}$ each are a hydrogen atom or a straight, branched or cyclic alkyl group of 1 to 10 carbon atoms, preferably 1 to 6 carbon atoms. $R^8$ and $R^9$ may bond together to form an aliphatic carbon ring of 3 to 8 carbon atoms with the carbon atom to which they are attached, such as a cyclopentane or cyclohexane ring. Each of $R^{10}$, $R^{11}$, $R^{12}$, $R^{13}$, $R^{14}$, $R^{15}$, $R^{16}$, $R^{17}$, $R^{18}$ and $R^{19}$ is a straight, branched or cyclic alkyl group of 1 to 10 carbon atoms, preferably 1 to 6 carbon atoms, an aryl group of 6 to 10 carbon atoms, preferably 6 to 8 carbon atoms, a trialkylsilyl group, a trialkylsiloxy group or a group of the following formula:

$$—X—(Si—X)_a-Si—R'''$$
with R', R'' substituents wherein X is a single bond, oxygen atom or alkylene group of 1 to 6 carbon atoms, preferably 1 to 3 carbon atoms, "a" is an integer of 1 to 10, especially 1 to 3, each of R', R'' and R''' is a straight, branched or cyclic alkyl group of 1 to 10 carbon atoms, preferably 1 to 6 carbon atoms, or trialkylsilyl group. Two of $R^{10}$, $R^{11}$ and $R^{12}$ two of $R^{14}$, $R^{15}$ and $R^{16}$, and two of $R^{17}$, $R^{18}$ and $R^{19}$ may bond together to form a ring of the following formula with the silicon atom to which they are attached,

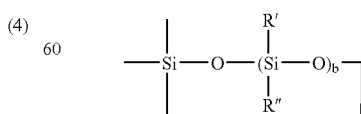

wherein R' and R'' are as defined above, and b is an integer of 2 to 9, especially 2 to 4.

(7)

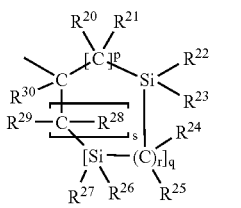

(8)

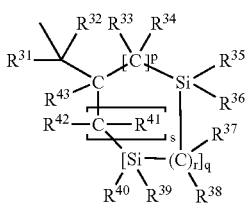

Herein $R^{30}$, $R^{31}$ and $R^{32}$ each are a straight, branched or cyclic alkyl group of 1 to 20 carbon atoms, preferably 1 to 6 carbon atoms, each of $R^{20}$, $R^{21}$, $R^{24}$, $R^{25}$, $R^{28}$, $R^{29}$, $R^{33}$, $R^{34}$, $R^{37}$, $R^{38}$, $R^{41}$ and $R^{42}$ is a hydrogen atom or a straight, branched or cyclic alkyl group of 1 to 20 carbon atoms, preferably 1 to 6 carbon atoms, each of $R^{22}$, $R^{23}$, $R^{26}$, $R^{27}$, $R^{35}$, $R^{36}$, $R^{39}$ and $R^{40}$ is a hydrogen atom, a straight, branched or cyclic alkyl group of 1 to 20 carbon atoms, preferably 1 to 6 carbon atoms, a fluorinated alkyl group of 1 to 20 carbon atoms, preferably 1 to 6 carbon atoms, or an aryl group of 6 to 20 carbon atoms, each of p, q, r and s is an integer of 0 to 10, especially 0 to 6, and $1 \leq p+q+s \leq 20$, especially $2 \leq p+q+s \leq 10$.

(9)

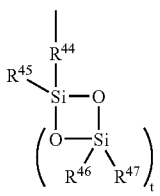

Herein $R^{44}$ is an alkylene group of 2 to 4 carbon atoms, each of $R^{45}$, $R^{46}$ and $R^{47}$ is a straight, branched or cyclic alkyl group of 1 to 10 carbon atoms, preferably 1 to 6 carbon atoms or an aryl group of 6 to 10 carbon atoms, and t is an integer of 2 to 10.

Suitable straight, branched or cyclic alkyl groups include, but are not limited to, methyl, ethyl, propyl, isopropyl, butyl, isobutyl, tert-butyl, pentyl, cyclopentyl, hexyl, cyclohexyl, octyl and decyl.

Suitable fluorinated alkyl groups include the foregoing alkyl groups in which some or all of the hydrogen atoms are substituted with fluorine atoms, for example, trifluoroethyl, trifluoropropyl and trifluorobutyl.

Suitable aryl groups include, but are not limited to, phenyl, tolyl and xylyl.

Suitable trialkylsilyl and trialkylsiloxy groups include those in which each alkyl group attached to a silicon atom is an alkyl of 1 to 6 carbon atoms. Specific examples of trialkylsilyl groups in which each alkyl group has 1 to 6 carbon atoms include trimethylsilyl, triethylsilyl and dimethyl-tert-butylsilyl.

Among the silicon-containing groups of the above formulae, the groups of formulae (4), (5) and (6) act as acid labile groups. Illustrative, non-limiting examples of the silicon-containing groups of formulae (4), (5) and (6) are given below.

(4)-1

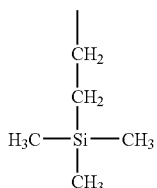

(4)-2

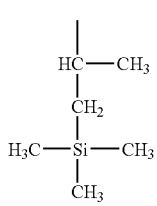

(4)-3

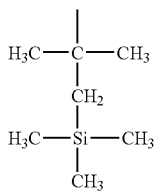

(4)-4

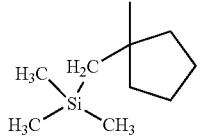

(4)-5

(4)-6

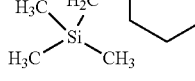

(4)-7

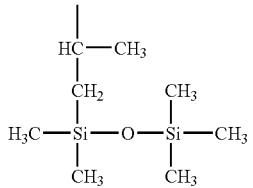

(4)-8

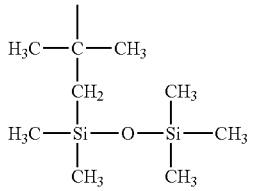

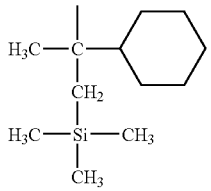

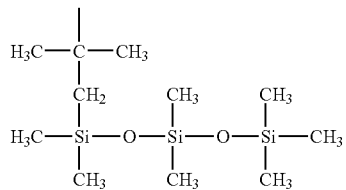
(4)-9
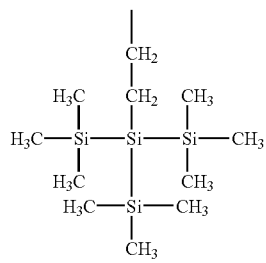
(4)-10
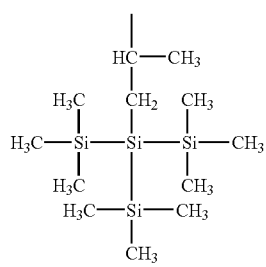
(4)-11
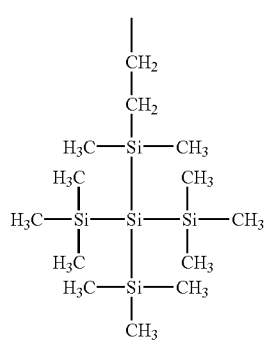
(4)-12
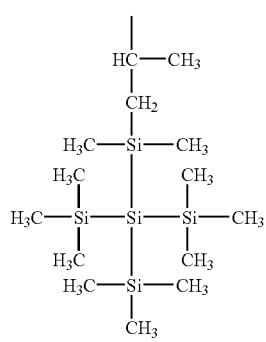
(4)-13
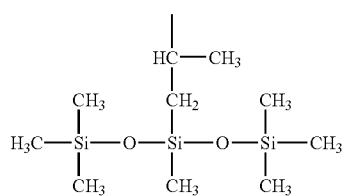
(4)-14
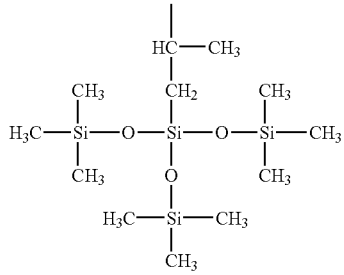
(4)-15
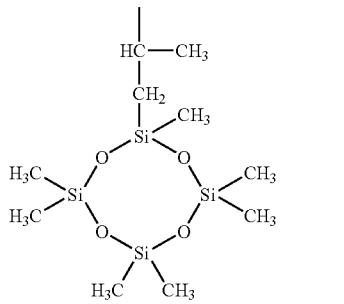
(4)-16
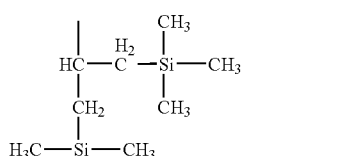
(5)-1
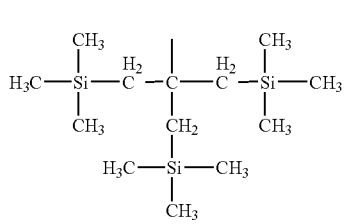
(6)-1
Illustrative, non-limiting examples of the cyclic silicon-containing acid labile groups of formulae (7) and (8) are given below.
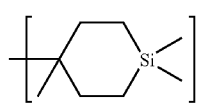
(7)-1
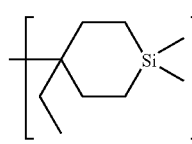
(7)-2
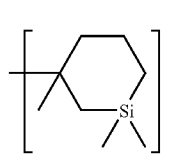
(7)-3

-continued

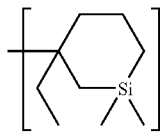 (7)-4

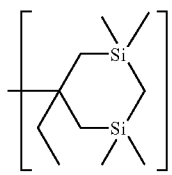 (7)-5

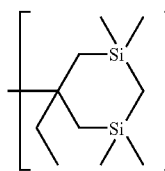 (7)-6

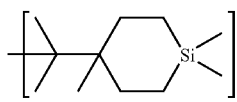 (8)-1

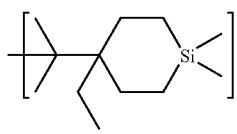 (8)-2

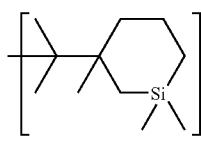 (8)-3

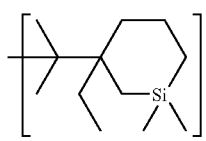 (8)-4

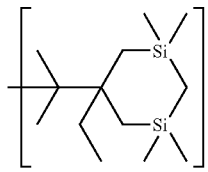 (8)-5

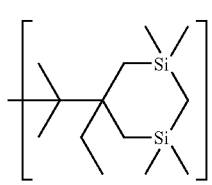 (8)-6

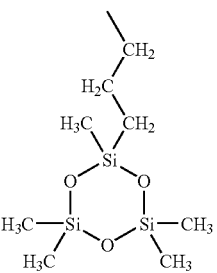 (9)-1

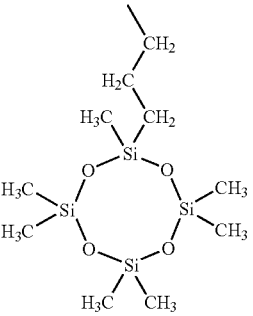 (9)-2

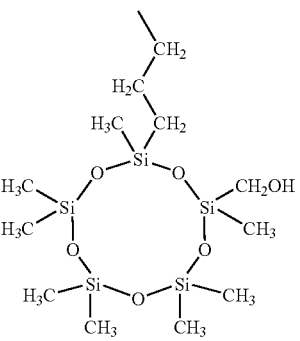 (9)-3

The polymer compounded as a base resin in the inventive resist composition is obtained by copolymerization of the silicon-containing monomer with the polar monomer having a LogP or cLogP value of up to 0.6, both defined above, and optionally and preferably, a hydroxystyrene monomer. In addition to these monomers, the polymer may further have copolymerized therewith an additional monomer having an acid labile group, especially (meth)acrylic acid or a hydroxystyrene monomer in which the hydrogen atom of the hydroxyl group is substituted with an acid labile group.

The acid labile group which can be used herein is selected from a variety of such groups, especially those groups of the general formulae (A-1), (A-2) and (A-3) below.

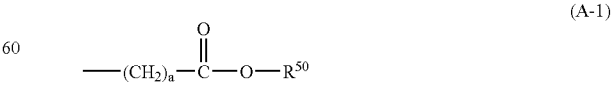 (A-1)

 (A-2)

Illustrative, non-limiting examples of the silicon-containing groups of formula (9) are given below as (9)-1 to (9)-3.

-continued

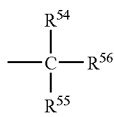
(A-3)

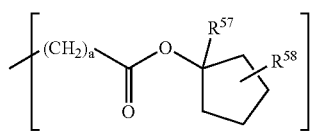
(A-1)-1

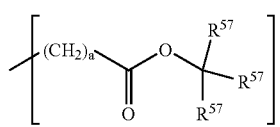
(A-1)-2

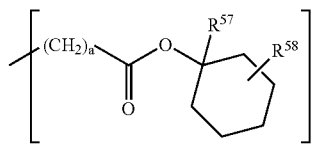
(A-1)-3

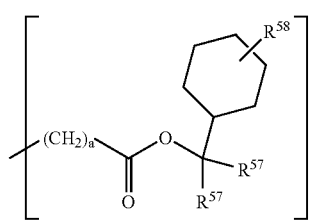
(A-1)-4

In formula (A-1), $R^{50}$ is a tertiary alkyl group having 4 to 20 carbon atoms, preferably 4 to 15 carbon atoms, a trialkylsilyl group in which each alkyl moiety has 1 to 6 carbon atoms, an oxoalkyl group having 4 to 20 carbon atoms, or a group of formula (A-3). Suitable tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Suitable trialkylsilyl groups include trimethylsilyl, triethylsilyl, and dimethyl-tert-butylsilyl. Suitable oxoalkyl groups include 3-oxocyclohexyl, 4-methyl-2-oxooxan-4-yl, and 5-methyl-2-oxooxolan-5-yl. The subscript "a" is an integer of 0 to 6.

In formula (A-2), each of $R^{51}$ and $R^{52}$ is a hydrogen atom or a straight, branched or cyclic alkyl group of 1 to 18 carbon atoms, preferably 1 to 10 carbon atoms, such as methyl, ethyl, propyl, isopropyl, n-butyl, sec-butyl, tert-butyl, cyclopentyl, cyclohexyl, 2-ethylhexyl and n-octyl. $R^{53}$ is selected from monovalent hydrocarbon groups of 1 to 18 carbon atoms, preferably 1 to 10 carbon atoms, which may contain a hetero atom such as oxygen atom, for example, straight, branched or cyclic alkyl groups, and substituted alkyl groups in which some hydrogen atoms are substituted with hydroxyl, alkoxy, oxo, amino or alkylamino groups. Illustrative examples of substituted alkyl groups are shown below.

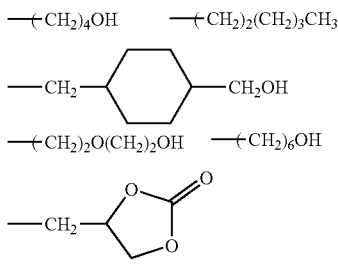

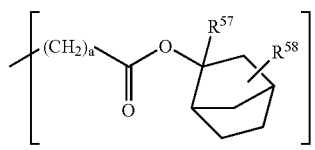
(A-1)-5

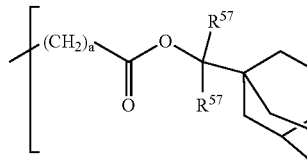
(A-1)-6

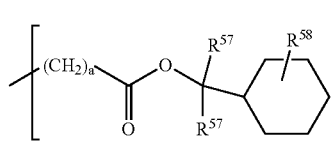
(A-1)-7

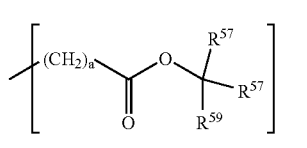
(A-1)-8

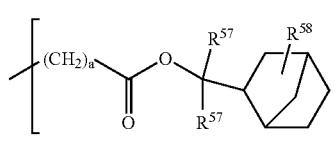
(A-1)-9

A pair of $R^{51}$ and $R^{52}$, $R^{51}$ and $R^{53}$, or $R^{52}$ and $R^{53}$ may form a ring. Each of $R^{51}$, $R^{52}$ and $R^{53}$ is a straight or branched alkylene group of 1 to 18 carbon atoms, preferably 1 to 10 carbon atoms, when they form a ring.

Illustrative, non-limiting, examples of the acid labile group of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups of formulae (A-1)-1 to (A-1)-9 below.

In the above formulae, $R^{57}$ is each independently a straight, branched or cyclic alkyl group of 1 to 10 carbon atoms or an aryl group of 6 to 20 carbon atoms; $R^{58}$ is a hydrogen atom or a straight, branched or cyclic alkyl group of 1 to 10 carbon atoms; and $R^{59}$ is each independently a straight, branched or cyclic alkyl group of 2 to 10 carbon atoms or an aryl group of 6 to 20 carbon atoms.

Of the acid labile groups of formula (A-2), straight or branched groups are exemplified by those of formulae (A-2)-1 to (A-2)-23 below.

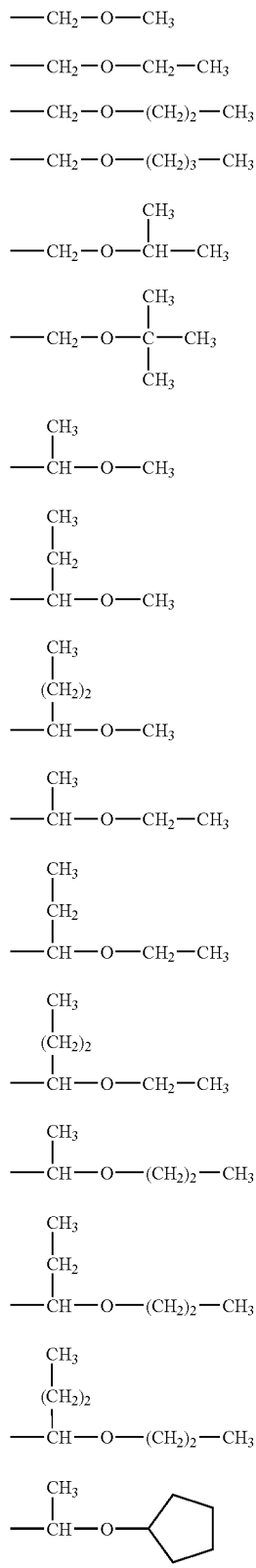

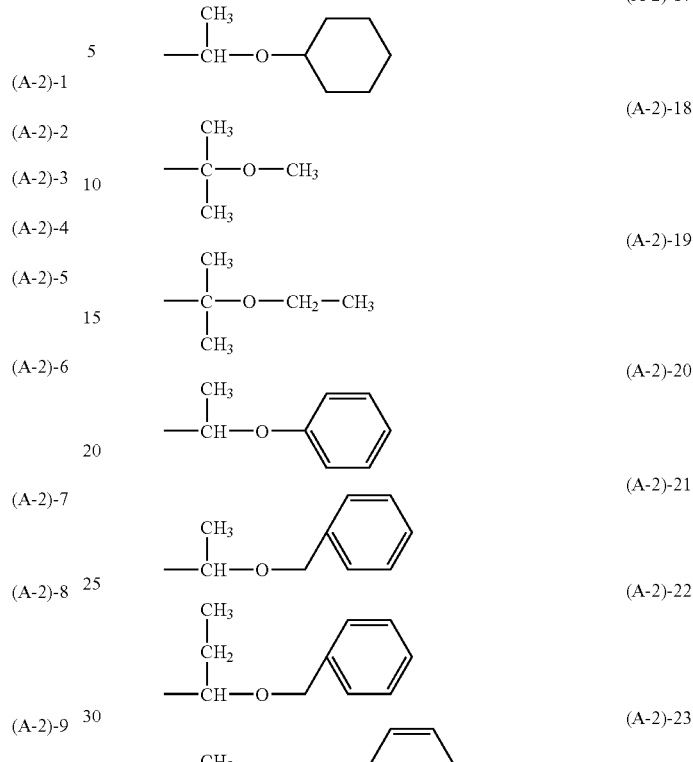

Of the acid labile groups of formula (A-2), examples of cyclic groups include tetrahydrofuran-2-yl, 2-methyltetrahydrofuran-2-yl, tetrahydropyran-2-yl and 2-methyltetrahydropyran-2-yl.

In an alternative embodiment, the polymer may be crosslinked within the molecule or between molecules with acid labile groups of the general formula (A-2a) or (A-2b).

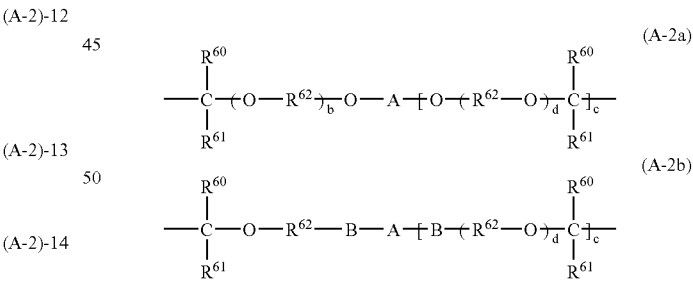

Herein $R^{60}$ and $R^{61}$ each are hydrogen or a straight, branched or cyclic alkyl group of 1 to 8 carbon atoms, or $R^{60}$ and $R^{61}$, taken together, may form a ring, and $R^{60}$ and $R^{61}$ are straight or branched alkylene groups of 1 to 8 carbon atoms when they form a ring; $R^{62}$ is a straight, branched or cyclic alkylene group of 1 to 10 carbon atoms; the subscripts b and d are 0 or integers of 1 to 10, and preferably 0 or integers of 1 to 5; c is an integer of 1 to 7; "A" is a (c+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; and B is —CO—O—, —NHCO—O— or —NHCONH—.

Preferably, "A" is selected from di- to tetra-valent straight, branched or cyclic alkylene groups of 1 to 20 carbon atoms, alkyltriyl groups, alkyltetrayl groups and arylene groups of 6 to 30 carbon atoms, which may be separated by a hetero atom and in which some of the hydrogen atoms attached to carbon atoms may be substituted with hydroxyl, carboxyl or acyl groups or halogen atoms. The subscript c is preferably an integer of 1 to 3.

The crosslinking acetal groups of formulae (A-2a) and (A-2b) are exemplified by the following formulae (A-2)-24 through (A-2)-31.

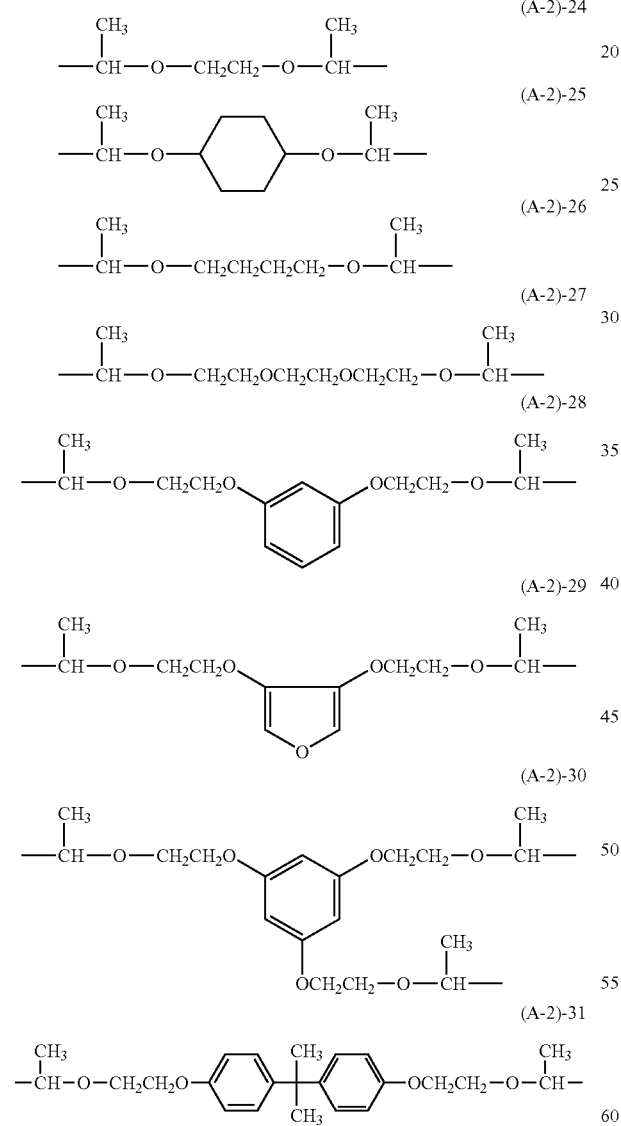

Referring to formula (A-3), each of $R^{54}$, $R^{55}$ and $R^{56}$ is a monovalent hydrocarbon group, typically a straight, branched or cyclic alkyl group of 1 to 20 carbon atoms, which may contain a hetero atom such as oxygen, sulfur, nitrogen or fluorine. A pair of $R^{54}$ and $R^{55}$, $R^4$ and $R^{56}$, or $R^{55}$ and $R^{56}$ may bond together to form a ring of 3 to 20 carbon atoms with the carbon atom to which they are attached.

Suitable tertiary alkyl groups of formula (A-3) include, but are not limited to, tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Also included in the tertiary alkyl groups are those of formulae (A-3)-1 to (A-3)-18 below.

(A-3)-9 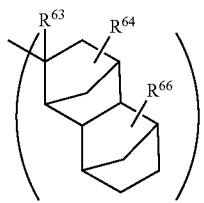

(A-3)-10 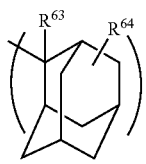

(A-3)-11 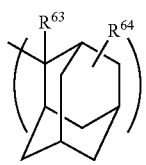

(A-3)-12 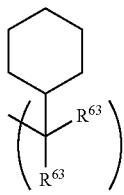

(A-3)-13 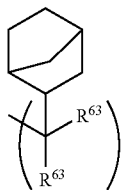

(A-3)-14 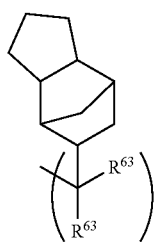

(A-3)-15 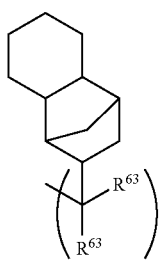

(A-3)-16 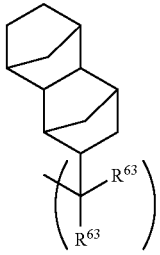

(A-3)-17

(A-3)-18

In the above formulae (A-3)-1 to (A-3)-18, $R^{63}$ is each independently a straight, branched or cyclic alkyl group of 1 to 8 carbon atoms or an aryl group of 6 to 20 carbon atoms, typically phenyl; each of $R^{64}$ and $R^{66}$ is hydrogen or a straight, branched or cyclic alkyl group of 1 to 20 carbon atoms; and $R^{65}$ is an aryl group of 6 to 20 carbon atoms, typically phenyl.

In a further embodiment, the polymer may be crosslinked within the molecule or between molecules with groups containing a di- or polyvalent alkylene or arylene group ($R^{67}$), represented by the general formula (A-3)-19 or (A-3)-20.

(A-3)-19 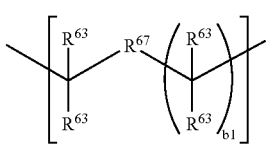

(A-3)-20 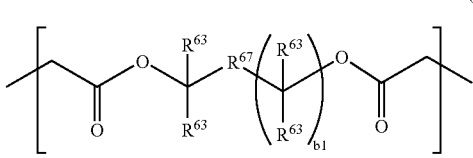

In formulae (A-3)-19 and (A-3)-20, $R^{63}$ is as defined above; $R^{67}$ is a straight, branched or cyclic alkylene group of 1 to 20 carbon atoms or an arylene group such as phenylene, which may contain a hetero atom such as oxygen, sulfur or nitrogen atom; b1 is an integer of 1 to 3.

Each of $R^{54}$, $R^{55}$ and $R^{56}$ in formula (A-3) may be a hydrocarbon group which contains a hetero atom such as oxygen, nitrogen or sulfur, examples of which are shown below by formulae (A)-1 to (A)-7.

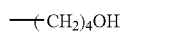   (A)-1

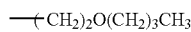   (A)-2

   (A)-3

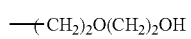   (A)-4

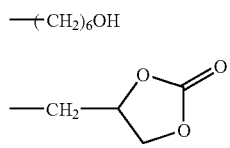   (A)-5

(A)-6

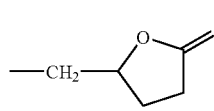   (A)-7

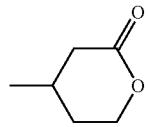   (A)-8

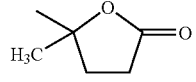   (A)-9

In formulae (A-1), (A-2) and (A-3), $R^{50}$, $R^{53}$ and $R^{56}$ are independently selected from substituted or unsubstituted aryl groups, typically phenyl, p-methylphenyl, p-ethylphenyl and alkoxy-substituted phenyl groups such as p-methoxyphenyl, aralkyl groups such as benzyl and phenethyl, the foregoing groups which contain an oxygen atom or the foregoing groups in which a hydrogen atom attached to a carbon atom is substituted with a hydroxyl group or two hydrogen atoms are substituted with an oxygen atom to form a carbonyl group, i.e., alkyl groups as represented by formulae (A)-1 to (A)-7, and oxoalkyl groups of formula (A)-8 or (A)-9.

Examples of the $C_{4-20}$ oxoalkyl group include 3-oxocyclohexyl and groups of the following formulae.

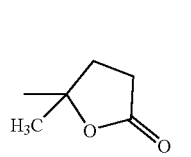 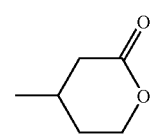

The silicon-containing polymer of the invention may have copolymerized therewith a monomer having a substituent group for improving adhesion, in addition to the monomer of formula (1) or (2). The adhesion-improving monomer denotes a monomer containing a hydrophilic substituent group such as anhydride, ester (or lactone), carbonate, alcohol, amide or ketone, examples of which are given below.

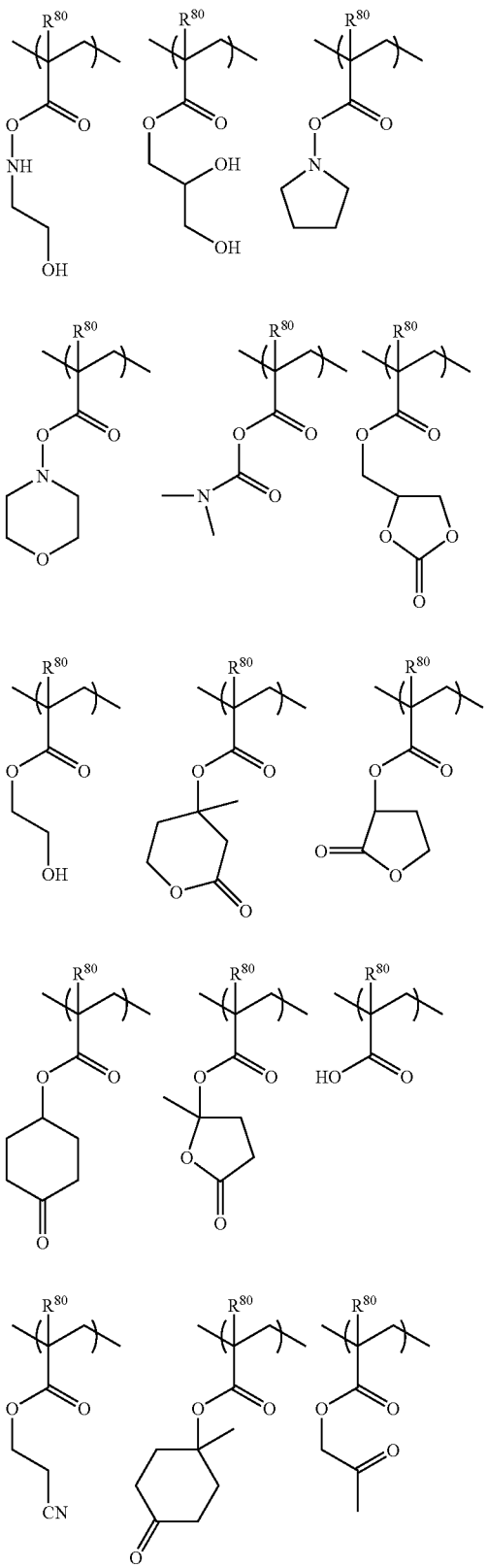

Herein, $R^{80}$ is hydrogen or methyl.

The polymers of the invention are generally synthesized by dissolving the essential monomers and an optional monomer or monomers in a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for preparation of the polymers of the invention are radical polymerization of triggering polymerization with radicals such as 2,2'-azobisisobutyronitrile (AIBN) or the like, and ion (anion) polymerization using catalysts such as alkyl lithium. These polymerization steps may be carried out in their conventional manner.

Also contemplated herein is a polymer having copolymerized therewith silicon-containing groups of plural types or adhesive groups of plural types represented by the formulae (1) and (2), or a blend of plural polymers having copolymerized therewith different silicon-containing groups or different adhesive groups represented by the formulae (1) and (2). It is also acceptable to blend plural polymers having different molecular weight or dispersity.

The polymers of the invention are generally represented by the formula below.

$$-UA_a-UB_b-UC_c-UD_d-UE_e-$$

Herein UA stands for units derived from the silicon-containing monomer, UB stands for units derived from the polar monomer having a LogP or cLogP value of up to 0.6, UC stands for units derived from the hydroxystyrene monomer, UD stands for units derived from the monomer having an acid labile group, and UE stands for units derived from the adhesion-improving monomer. The values of a, b, c, d and e are preferably selected to meet:

$0.01 \leq a/(a+b+c+d+e) \leq 0.9$,
  more preferably $0.02 \leq a/(a+b+c+d+e) \leq 0.8$,
  most preferably $0.04 \leq a/(a+b+c+d+e) \leq 0.7$,
$0.05 \leq b/(a+b+c+d+e) \leq 0.9$,
  more preferably $0.1 \leq b/(a+b+c+d+e) \leq 0.8$,
  most preferably $0.15 \leq b/(a+b+c+d+e) \leq 0.7$,
$0.2 \leq c/(a+b+c+d+e) \leq 0.9$,
  more preferably $0.3 \leq c/(a+b+c+d+e) \leq 0.8$,
  most preferably $0.4 \leq c/(a+b+c+d+e) \leq 0.7$,
$0 \leq d/(a+b+c+d+e) \leq 0.5$,
  more preferably $0 \leq d/(a+b+c+d+e) \leq 0.4$,
  most preferably $0 \leq d/(a+b+c+d+e) \leq 0.3$, and
$0 \leq e/(a+b+c+d+e) \leq 0.5$,
  more preferably $0 \leq e/(a+b+c+d+e) \leq 0.4$,
  most preferably $0 \leq e/(a+b+c+d+e) \leq 0.3$.

The polymers preferably have a weight average molecular weight (Mw) of about 1,000 to 100,000, more preferably about 2,000 to 50,000, and a molecular weight dispersity (Mw/Mn) of 1.0 to 3.0, more preferably 1.0 to 2.0. It is recommended that the polymer product as polymerized is processed into a narrow disperse polymer having a dispersity of up to 1.5 by cutting off a high- or low-molecular weight fraction because an improvement in resist resolution is expectable.

Resist Composition

The resist compositions of the invention are advantageously chemical amplification type resist compositions, and especially chemical amplification type positive working resist compositions.

In one embodiment, the chemically amplified positive resist composition is defined as comprising (A) the above-defined polymer as a base resin, (B) a photoacid generator, (C) an organic solvent, and preferably (D) a dissolution inhibitor and/or (E) a basic compound.

Component (B)

Suitable examples of the photoacid generator (B) include onium salts of general formula (10) below, diazomethane derivatives of formula (11), glyoxime derivatives of formula (12), β-ketosulfone derivatives, disulfone derivatives, nitrobenzylsulfonate derivatives, sulfonic acid ester derivatives, and imidoyl sulfonate derivatives.

The onium salts used as the photoacid generator are of the general formula (10).

$$(R^{100})_cM^+K^- \qquad (10)$$

In formula (10), $R^{100}$, which may be the same or different, is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and c is 2 or 3.

Illustrative examples of alkyl groups represented by $R^{100}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 2,3,4,5,6-pentafluorobenzenesulfonate; and alkylsulfonate ions such as mesylate and butanesulfonate.

The diazomethane derivatives used as the photoacid generator are of the general formula (11).

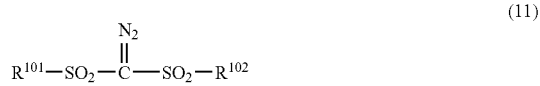

(11)

In the formula, $R^{101}$ and $R^{102}$, which may be the same or different, are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{101}$ and $R^{102}$ include methyl, ethyl, propyl, butyl, amyl, cyclopentyl, cyclohexyl, norbornyl, and adamantyl. Exemplary halogenated alkyl groups include trifluoromethyl, 2,2,2-trifluoroethyl, 2,2,2-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 2,3,4,5,6-pentafluorophenyl. Exemplary aralkyl groups include benzyl and phenethyl.

The glyoxime derivatives used as the photoacid generator are of the general formula (12).

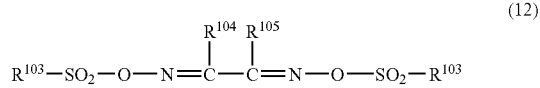

(12)

In the formula, $R^{103}$, $R^{104}$, and $R^{105}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{104}$ and $R^{105}$ may bond together to form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{103}$ to $R^{105}$ are exemplified by the same groups as mentioned above for $R^{101}$ and $R^{102}$. Examples of alkylene groups represented by $R^{104}$ and $R^{105}$ include methylene, ethylene, propylene, butylene, and hexylene.

Illustrative examples of the photoacid generator include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; and naphthoquinone diazide sulfonate derivatives. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 50 parts, especially 0.5 to 40 parts by weight per 100 parts by weight of the entire base resin. At less than 0.2 part, the amount of acid generated during exposure would be too small and the sensitivity and resolution be poor, whereas the addition of more than 50 parts would lower the transmittance of the resist and result in a poor resolution.

Component (C)

The organic solvent (C) used in the resist composition of the invention may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

The organic solvent is preferably added in an amount of about 100 to 5,000 parts, especially about 200 to 3,000 parts by weight per 100 parts by weight of the entire base resin.

Component (D)

The dissolution inhibitor (D) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor. The acid labile groups may be those of the above formulae (A-1) to (A-8).

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl)methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol.

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)ethylidene]bisphenol-4,4'-di-t-butoxycarbonyl, bis(4-(2'-tetrahydropyranyloxy)phenyl) methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl) propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis (4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl) methane, tris(4-tert-butoxycarbonyloxyphenyl)methane, tris (4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (D) is up to about 20 parts, and especially up to about 15 parts by weight per 100 parts by weight of the entire base resin in the composition. With more than 20 parts of the dissolution inhibitor, the resist composition becomes less heat resistant because of an increased content of monomer components.

Component (E)

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, the aliphatic amines are preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)_n(Y)_{3-n} \qquad \text{(B)-1}$$

In the formula, n is equal to 1, 2 or 3; side chain X, which may be the same or different, is independently selected from groups of the following general formulas (X)-1 to (X)-3, and two or three X's may bond together to form a ring; and side chain Y, which may be the same or different, is independently hydrogen or a straight, branched or cyclic alkyl group of 1 to 20 carbon atoms which may contain a hydroxyl group or ether.

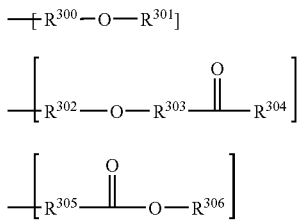

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-(2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]-amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (B)-2.

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing basic compounds having formula (B)-2 include
1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate,
2-piperidinoethyl acetate,
2-morpholinoethyl acetate,
2-(1-pyrrolidinyl)ethyl formate,
2-piperidinoethyl propionate,
2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate,
methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate, butyl 3-morpholinopropionate,
cyclohexyl 3-piperidinopropionate,
α-(1-pyrrolidinyl)methyl-γ-butyrolactone,
β-piperidino-γ-butyrolactone,
β-morpholino-δ-valerolactone,
methyl 1-pyrrolidinylacetate,
methyl piperidinoacetate,
methyl morpholinoacetate,
methyl thiomorpholinoacetate,
ethyl 1-pyrrolidinylacetate, and
2-methoxyethyl morpholinoacetate.

Also, one or more of cyano-bearing basic compounds having the following general formulae (B)-3 to (B)-6 may be blended.

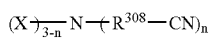
(B)-3

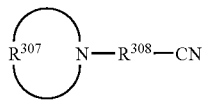
(B)-4

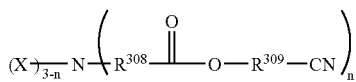
(B)-5

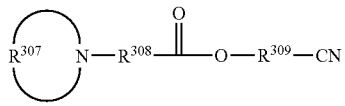
(B)-6

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds include
3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiononitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiononitrile,
N-(2-cyanoethyl)-N-tetrahydrofurfuryl-3-aminopropiononitrile,
N,N-bis(2-cyanoethyl)-3-aminopropiononitrile, diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopripionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile,
1-piperidinepropiononitrile,
4-morpholinepropiononitrile,
1-pyrrolidineacetonitrile,
1-piperidineacetonitrile,
4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

The basic compounds may be used alone or in admixture of two or more. The basic compound is preferably formulated in an amount of 0.001 to 2 parts, and especially 0.01 to 1 part by weight, per 100 parts by weight of the entire base resin in the resist composition. Less than 0.001 part of the basic compound would fail to provide the desired effect whereas more than 2 parts of the basic compound would result in too low a sensitivity.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for 30 seconds to 5 minutes. A patterning mask having the desired pattern may then be placed over the resist film, and the film exposed through the mask to an electron beam or to high-energy radiation having a wavelength of less than 300 nm, such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for 30 seconds to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially KrF (248 nm), ArF (193 nm), Kr$_2$ (146 nm) or KrAr (134 nm) excimer laser or a laser, especially F$_2$ (157 nm) or Ar$_2$ (126 nm) laser, x-rays, or an electron beam. The desired pattern may not be obtainable outside the upper and lower limits of the above range.

Figure 1B:
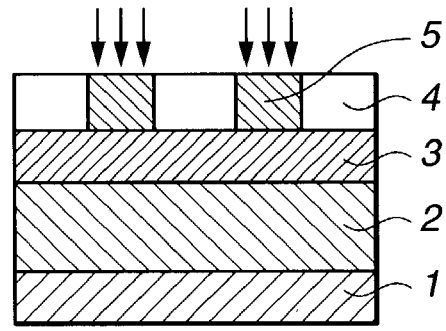
Figure 1C:
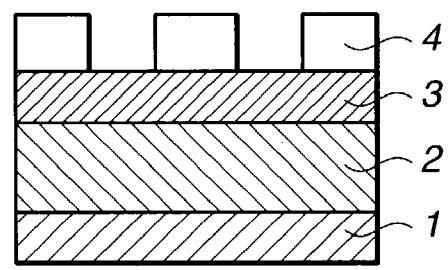
Figure 1D:
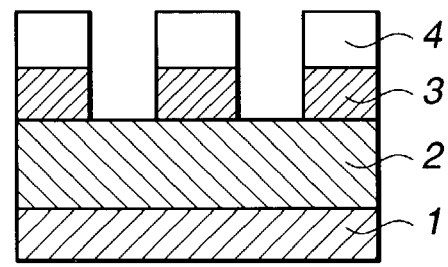
Figure 1E:
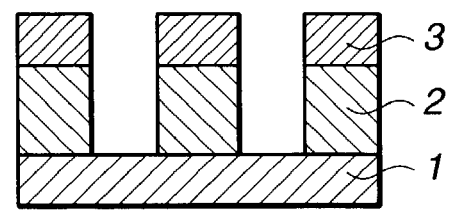

Referring to FIG. 1, there is illustrated in cross section a process involving forming a silicon-containing resist pattern through exposure, PEB and development steps, patterning an underlying organic film by oxygen gas etching, and processing a further underlying film by dry etching. In FIG. 1A, a layer structure includes a support substrate 1, a processable substrate 2 of SiO$_2$, SiN or the like, an organic film 3 of a novolac resin, polyhydroxystyrene or the like, and a resist layer 4 formed of the resist composition of the invention. In FIG. 1B, selected areas 5 of the resist layer 4 are exposed to light. PEB and development are then carried out to remove the exposed areas as shown in FIG. 1C. In FIG. 1D, the exposed areas of the organic film 3 are etched away with oxygen plasma. In FIG. 1E, the exposed areas of the processable substrate 2 are etched away with CF gas, completing the pattern.

The oxygen gas etching is a reactive plasma etching using oxygen gas as a main component and can process the underlying organic film at a high aspect ratio. SO$_2$, CO$_2$, CO, NH$_3$ or N$_2$ gas may be added to oxygen gas for protecting side walls for preventing the film from being configured to a T-top profile by overetching. Prior to the oxygen gas etching, brief etching with a fluorocarbon gas may be carried out for removing any scum of the resist after development and smoothening line edges to prohibit roughening. The subsequent dry etching of the processable film may be etching using a fluorocarbon gas as a main component when the processable film is SiO$_2$ or Si$_3$N$_4$. Exemplary fluorocarbon gases are CF$_4$, CHF$_3$, CH$_2$F$_2$, C$_2$F$_6$, C$_3$F$_8$, C$_4$F$_{10}$ and C$_5$F$_{12}$. At the same time as the dry etching of the processable film, the silicon-containing resist film can be stripped off. Etching with chlorine or bromine gas as a main component is employed when the processable film is polysilicon, tungsten silicide or TiN/Al.

Since the resist composition of the invention has excellent resistance to etching with chlorine or bromine gas as a main component, the processing technique may be the same as used for the single layer resist.

Figure 2A:
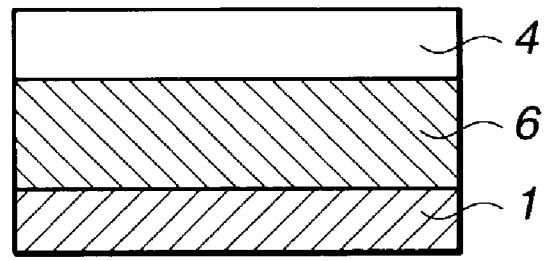
FIG. 2 schematically illustrates a layer structure patterning process involving chlorine etching.
Figure 2B:
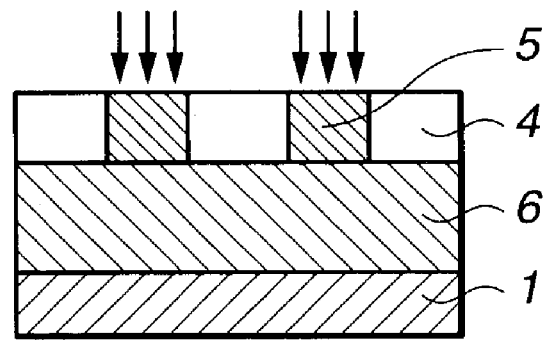
Figure 2C:
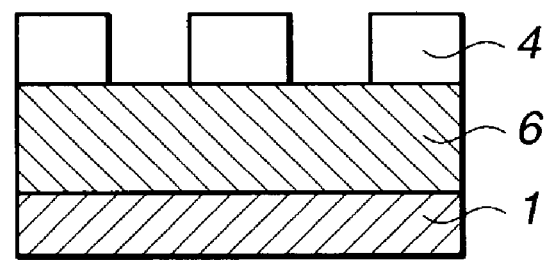
Figure 2D:
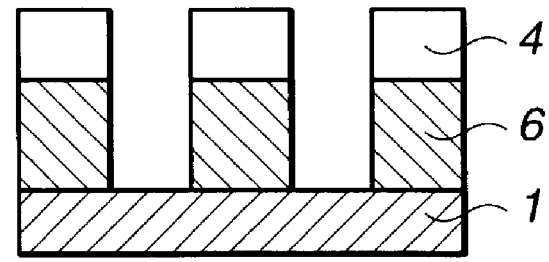

This embodiment is illustrated in FIG. 2. The layer structure shown in FIG. 2A includes a support substrate 1, a processable substrate 6, and a resist layer 4 according to the invention. Exposure of selected areas 5 of the resist layer 4 is followed by PEB and development as shown in FIGS. 2B and 2C. Thereafter, the processable substrate 6 is etched with a Cl gas as shown in FIG. 2D. In this embodiment, the silicon-containing resist film according to the invention is formed in a desired pattern directly on the processable film, which can be processed by etching with chlorine or bromine gas as a main component.

The resist composition comprising a siliceous monomer/polar monomer copolymer as a base resin according to the invention is sensitive to high-energy radiation, and has excellent sensitivity and resolution at a wavelength of less than 300 nm as well as satisfactory oxygen plasma etching resistance. These features of the inventive resist composition enable its use particularly in the two-layer resist technology, and permit a finely defined pattern having sidewalls perpendicular to the substrate to be easily be formed, making the resist ideal as a micropatterning material in VLSI fabrication.

EXAMPLE

Synthesis Examples and Examples are given below together with Comparative Examples for further illustrating the invention although the invention is not limited thereby. The abbreviations used herein are GPC for gel permeation chromatography, NMR for nuclear magnetic resonance, Mw for weight average molecular weight, Mn for number average molecular weight, THF for tetrahydrofuran, and AIBN for 2,2'-azobisisobutyronitrile.

(1) Synthesis of Silicon-containing Polymers

It is noted that Monomers 1 to 5 are shown at the end of Synthesis Examples.

Synthesis Example 1

Synthesis of tris(trimethylsilyl)silylethyl methacrylate (Monomer 1)/3-oxo-2,7-dioxatricyclo [4.2.1.0$^{4,8}$]-9-nonyl methacrylate (monomer 2)/p-hydroxystyrene copolymer (15:25:60), Polymer 1

In a 1-liter flask, 60 g of tris(trimethylsilyl)silylethyl methacrylate, 80 g of 3-oxo-2,7-dioxatricyclo[4.2.1.0$^{4,8}$]-9-nonyl methacrylate and 100 g of p-hydroxystyrene were dissolved in 560 ml of THF. The flask was thoroughly purged of oxygen and then charged with 5.5 g of the initiator AIBN. The flask was heated to 60° C., at which polymerization reaction was conducted for 24 hours.

The polymer product was worked up by pouring the reaction mixture into a solvent mixture of hexane/ether (3/2) for precipitation. The polymer was separated. There was obtained 168 g of a white polymer that is a tris(trimethylsilyl)silylethyl methacrylate/3-oxo-2,7-dioxatricyclo[4.2.1.0$^{4.8}$]-9-nonyl methacrylate/p-hydroxystyrene copolymer (copolymerization ratio 15:25:60), designated Polymer 1.

Polymer 1 had a weight average molecular weight (Mw) of 16,000 as measured by the light scattering method and a dispersity (Mw/Mn) of 1.65 as determined from the GPC elution curve. A $^1$H-NMR analysis demonstrated that Polymer 1 consisted of the monomers in a molar ratio of approximately 15:25:60.

Synthesis Example 2

Synthesis of 1,4,4-trimethyl-4-silacyclohexyl methacrylate (monomer 3)/3-oxo-2,7-dioxatricyclo [4.2.1.0$^{4.8}$]-9-nonyl methacrylate (monomer 2)/p-hydroxystyrene copolymer (40:20:40), Polymer 2

In a 1-liter flask, 75 g of 1,4,4-trimethyl-4-silacyclohexyl methacrylate, 37 g of 3-oxo-2,7-dioxatricyclo[4.2.1.0$^{4.8}$]-9-nonyl methacrylate and 40 g of p-hydroxystyrene were dissolved in 300 ml of THF. The flask was thoroughly purged of oxygen and then charged with 3.4 g of the initiator AIBN. The flask was heated to 60° C., at which polymerization reaction was conducted for 24 hours.

The polymer product was worked up by pouring the reaction mixture into a solvent mixture of hexane/ether (3/2) for precipitation. The polymer was separated. There was obtained 121 g of a white polymer that is a 1,4,4-trimethyl-4-silacyclohexyl methacrylate/3-oxo-2,7-dioxatricyclo [4.2.1.0$^{4.8}$]-9-nonyl methacrylate/p-hydroxystyrene copolymer (copolymerization ratio 40:20:40), designated Polymer 2.

Polymer 2 had a Mw of 13,000 as measured by the light scattering method and a dispersity (Mw/Mn) of 1.85 as determined from the GPC elution curve. A $^1$H-NMR analysis demonstrated that Polymer 2 consisted of the monomers in a molar ratio of approximately 40:20:40.

Synthesis Example 3

Synthesis of t-butyl methacrylate/tris(trimethylsilyl)-silylethyl methacrylate (monomer 1)/3-oxo-2,7-dioxatricyclo-[4.2.1.0$^{4.8}$]-9-nonyl methacrylate (monomer 2)/p-hydroxystyrene copolymer (10:15:25:50), Polymer 3

In a 1-liter flask, 28 g of t-butyl methacrylate, 60 g of tris(trimethylsilyl)silylethyl methacrylate, 65 g of 3-oxo-2,7-dioxatricyclo[4.2.1.0$^{4.8}$]-9-nonyl methacrylate and 88 g of p-hydroxystyrene were dissolved in 560 ml of THF. The flask was thoroughly purged of oxygen and then charged with 5.5 g of the initiator AIBN. The flask was heated to 60° C., at which polymerization reaction was conducted for 24 hours.

The polymer product was worked up by pouring the reaction mixture into a solvent mixture of hexane/ether (3/2) for precipitation. The polymer was separated. There was obtained 177 g of a white polymer that is a t-butyl methacrylate/tris(trimethylsilyl)silylethyl methacrylate/3-oxo-2,7-dioxatricyclo[4.2.1.0$^{4.8}$]-9-nonyl methacrylate/p-hydroxystyrene copolymer (copolymerization ratio 10:15:25:50), designated Polymer 3.

Polymer 3 had a Mw of 14,800 as measured by the light scattering method and a dispersity (Mw/Mn) of 1.81 as determined from the GPC elution curve. A $^1$H-NMR analysis demonstrated that Polymer 3 consisted of the monomers in a molar ratio of approximately 10:15:25:50.

Synthesis Example 4

Synthesis of t-butyl methacrylate/Monomer 4/3-oxo-2,7-dioxatricyclo[4.2.1.0$^{4.8}$]-9-nonyl methacrylate/p-hydroxystyrene copolymer (10:15:25:50), Polymer 4

In a 1-liter flask, 28 g of t-butyl methacrylate, 92 g of Monomer 4, 65 g of 3-oxo-2,7-dioxatricyclo[4.2.1.0$^{4.8}$]-9-nonyl methacrylate and 88 g of p-hydroxystyrene were dissolved in 560 ml of THF. The flask was thoroughly purged of oxygen and then charged with 5.5 g of the initiator AIBN. The flask was heated to 60° C., at which polymerization reaction was conducted for 24 hours.

The polymer product was worked up by pouring the reaction mixture into a solvent mixture of hexane/ether (3/2) for precipitation. The polymer was separated. There was obtained 192 g of a white polymer that is a t-butyl methacrylate/Monomer 4/3-oxo-2,7-dioxatricyclo[4.2.1.0$^{4.8}$]-9-nonyl methacrylate/p-hydroxystyrene copolymer (copolymerization ratio 10:15:25:50), designated Polymer 4.

Polymer 4 had a Mw of 13,700 as measured by the light scattering method and a dispersity (Mw/Mn) of 1.83 as determined from the GPC elution curve. A $^1$H-NMR analysis demonstrated that Polymer 4 consisted of the monomers in a molar ratio of approximately 10:15:25:50.

Comparative Synthesis Example 1

Synthesis of tris(trimethylsilyl)silylethyl methacrylate/p-hydroxystyrene copolymer (15:85), comparative Polymer 1

In a 1-liter flask, 85 g of tris(trimethylsilyl)silylethyl methacrylate (Monomer 1) and 220 g of p-hydroxystyrene were dissolved in 630 ml of toluene. The flask was thoroughly purged of oxygen and then charged with 6.6 g of the initiator AIBN. The flask was heated to 60° C., at which polymerization reaction was conducted for 24 hours.

The polymer product was worked up by pouring the reaction mixture into a solvent mixture of hexane/ether (3/2) for precipitation. The polymer was separated. There was obtained 191 g of a white polymer that is a tris(trimethylsilyl)silylethyl methacrylate/p-hydroxystyrene copolymer (copolymerization ratio 15:85), designated Comparative Polymer 1.

Comparative Polymer 1 had a Mw of 13,500 as measured by the light scattering method and a dispersity (Mw/Mn) of 1.58 as determined from the GPC elution curve. A $^1$H-NMR analysis demonstrated that Comparative Polymer 1 consisted of the monomers in a molar ratio of approximately 15:85.

Comparative Synthesis Example 2

Synthesis of tris(trimethylsilyl)silylethyl methacrylate/5-oxo-oxatricyclo[4.2.1.0$^{3.7}$]nonan-2-yl methacrylate/p-hydroxystyrene copolymer (15:25:60), Comparative Polymer 2

In a 1-liter flask, 70 g of tris(trimethylsilyl)silylethyl methacrylate, 80 g of 5-oxo-oxatricyclo-[4.2.1.0$^{3.7}$]nonan-2-yl methacrylate (Monomer 5) and 100 g of p-hydroxystyrene were dissolved in 560 ml of toluene. The flask was thoroughly purged of oxygen and then charged with 5.5 g of the initiator AIBN. The flask was heated to 60° C., at which polymerization reaction was conducted for 24 hours.

The polymer product was worked up by pouring the reaction mixture into a solvent mixture of hexane/ether (3/2) for precipitation. The polymer was separated. There was obtained 125 g of a white polymer that is a tris(trimethylsilyl)silylethyl methacrylate/5-oxo-oxatricyclo[4.2.1.0$^{3.7}$]nonan-2-yl methacrylate/p-hydroxystyrene copolymer (copolymerization ratio 15:25:60), designated Comparative Polymer 2.

Comparative Polymer 2 had a Mw of 15,300 as measured by the light scattering method and a dispersity (Mw/Mn) of 1.87 as determined from the GPC elution curve. A $^1$H-NMR analysis demonstrated that Comparative Polymer 2 consisted of the monomers in a molar ratio of approximately 15:25:60.

Monomer 1

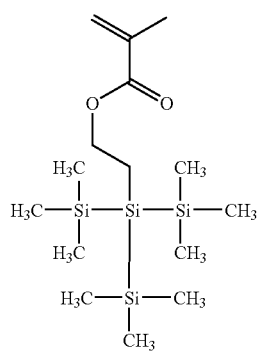

Monomer 2

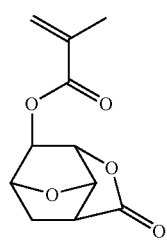

Monomer 3

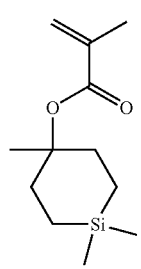

Monomer 4

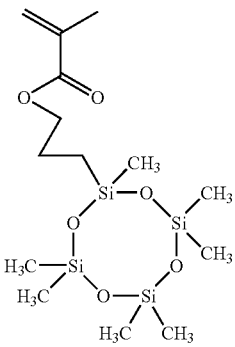

Monomer 5

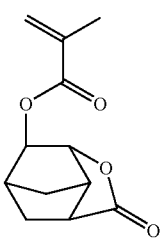

(2) Dry Etching Test

A polymer solution was prepared by thoroughly dissolving 1 g of each of the above-synthesized polymers in 5 g of propylene glycol monomethyl ether acetate and passing the solution through a 0.1-micron filter. The polymer solution was spin coated to a silicon wafer and baked at 100° C. for 90 seconds to form a polymer film of 500 nm thick. The wafer having the polymer film formed thereon was subjected to dry etching under two sets of conditions. A difference in polymer film thickness before and after the etching test was determined.

(1) O$_2$ Etching Test:

Using a dry etching instrument TE-8500P by Tokyo Electron K.K., the resist films were etched with oxygen gas under the following conditions.

| | |
|---|---|
| Chamber pressure | 450 mTorr |
| RF power | 600 W |
| Ar gas flow rate | 40 sccm |
| O$_2$ gas flow rate | 60 sccm |
| Gap | 9 mm |
| Time | 60 sec |

(2) Cl$_2$/BCl$_3$ Etching Test:

Using a dry etching instrument L-507D-L by Nichiden Anerba K.K., the resist films were etched with halide gases under the following conditions.

| | |
|---|---|
| Chamber pressure | 300 mTorr |
| RF power | 300 W |
| Gap | 9 mm |
| Cl$_2$ gas flow rate | 30 sccm |
| BCl$_3$ gas flow rate | 30 sccm |
| CHF$_3$ gas flow rate | 100 sccm |
| O$_2$ gas flow rate | 2 sccm |
| Time | 60 sec |

The results are shown in Table 1.

TABLE 1

| Polymer | O₂ gas etching rate (nm/min) | Cl₂/BCl₃ gas etching rate (nm/min) |
| --- | --- | --- |
| Polymer 1 | 305 | 250 |
| Polymer 2 | 330 | 290 |
| Polymer 3 | 250 | 288 |
| Polymer 4 | 255 | 262 |
| Comparative Polymer 1 | 380 | 250 |
| Comparative Polymer 2 | 320 | 350 |

(3) Resist Evaluation

Resist solutions were prepared by thoroughly dissolving each of the above-synthesized polymers, photoacid generator (PAG1 to PAG4) and dissolution inhibitor (DRI1, DRI2) in 1,000 parts by weight of propylene glycol monomethyl ether acetate (PGMEA) containing 0.01% by weight of surfactant FC-430 (Sumitomo 3M Ltd.) in the combination and amounts shown in Tables 2 and 3, followed by filtration through a 0.1-micron Teflon filter.

A novolac base resist material OFPR-800 (Tokyo Ouka Kogyo K.K.) was applied onto on a silicon wafer and heat cured at 300° C. for 5 minutes to form a lower layer of 0.5 µm thick. An antireflective material DUV-30 (Brewer Science) was spin coated onto the lower layer and baked at 110° C. for 30 seconds and then at 200° C. for 60 seconds, forming an antireflective film of 55 nm thick.

Each resist solution was spin coated onto the cured DUV-30/novolac resist and baked on a hot plate at 120° C. for 60 seconds to form a resist film of 0.2 µm thick. The resist film was exposed using an KrF excimer laser stepper S203B (Nikon Corporation; NA 0.68, σ0.75, ⅔ annular illumination), then baked (PEB) at 110° C. for 60 seconds, and developed for 60 seconds with a 2.38% aqueous solution of tetramethylammonium hydroxide (TMAH), thereby giving a positive pattern.

The resist pattern was evaluated as follows. The sensitivity of the resist is the optimum dose which provided a 0.15 µm line-and-space pattern in a ratio of 1:1. The resolution is defined as the minimum line width (µm) of the line-and-space pattern that separated at this dose.

Line edge roughness was measured on a 0.15 µm line-and-space pattern at 1:1, and measurements were computed as 3 σ.

For a 0.15 µm line-and-space pattern with a solitary line at 1:10, the space was observed under SEM for the presence of residues and the amount of residues if any.

The results are shown in Tabled 2 and 3.

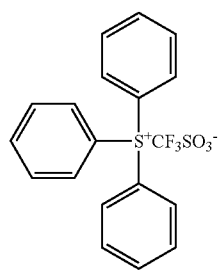

PAG1

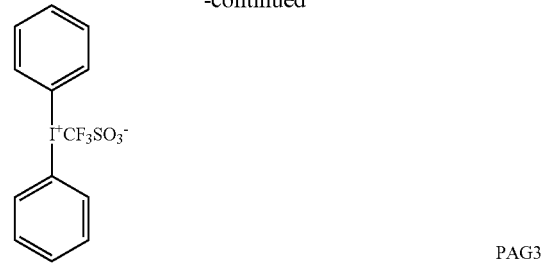

PAG2

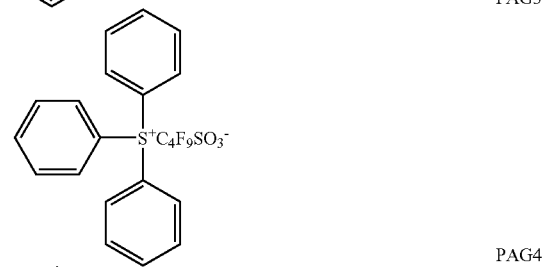

PAG3

PAG4

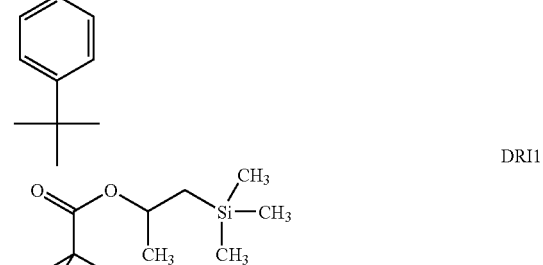

DRI1

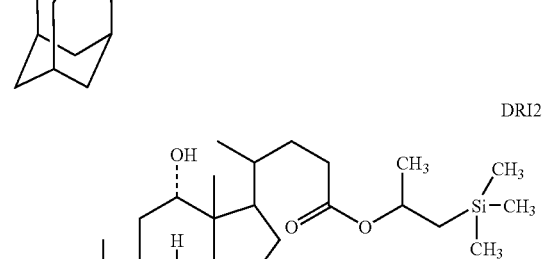

DRI2

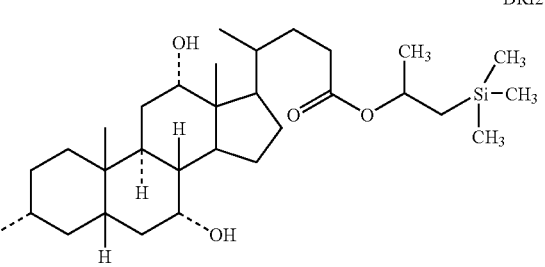

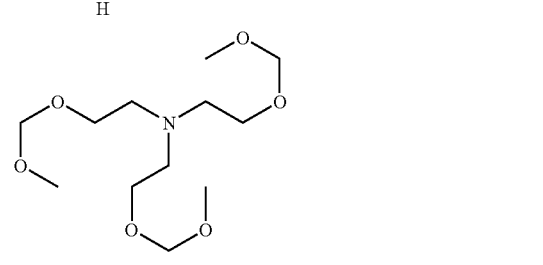

TMMEA

-continued

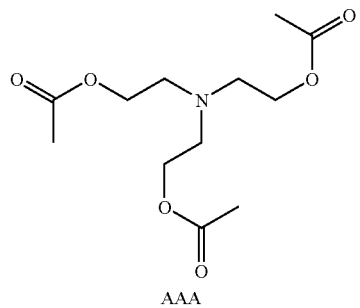
AAA

-continued

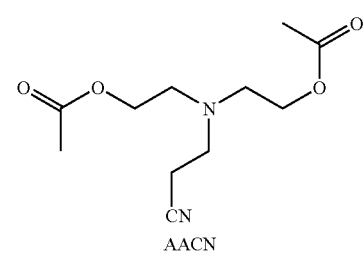
AACN

TABLE 2

| Polymer (pbw) | Photoacid generator (pbw) | Basic compound (pbw) | Dissolution inhibitor (pbw) | Sensitivity, mJ/cm² | Resolution, μm | Line edge roughness, nm | Residues in space |
|---|---|---|---|---|---|---|---|
| Polymer 1 (100) | PAG1 (2) | Tributylamine (0.1) | — | 26 | 0.13 | 5.3 | nil |
| Polymer 2 (100) | PAG1 (2) | Tributylamine (0.1) | — | 28 | 0.13 | 4.5 | nil |
| Polymer 3 (100) | PAG1 (2) | Tributylamine (0.1) | — | 24 | 0.13 | 5.5 | nil |
| Polymer 4 (100) | PAG1 (2) | Tributylamine (0.1) | — | 25 | 0.13 | 4.3 | nil |
| Polymer 1 (100) | PAG2 (2) | Tributylamine (0.1) | — | 16 | 0.13 | 5.6 | nil |
| Polymer 1 (100) | PAG3 (4) | Tributylamine (0.1) | — | 31 | 0.12 | 6.3 | nil |
| Polymer 1 (100) | PAG4 (4) | Tributylamine (0.1) | — | 26 | 0.12 | 6.8 | nil |
| Polymer 1 (100) | PAG1 (2) | TMMEA (0.2) | — | 28 | 0.13 | 5.2 | nil |
| Polymer 1 (100) | PAG3 (4) | TMMEA (0.2) | — | 32 | 0.12 | 5.5 | nil |
| Polymer 1 (100) | PAG1 (2) | AAA (0.2) | — | 33 | 0.13 | 5.3 | nil |
| Polymer 1 (100) | PAG1 (2) | AACN (0.2) | — | 36 | 0.12 | 5.4 | nil |
| Polymer 1 (100) | PAG1 (2) | Tributylamine (0.1) | DRI1 | 22 | 0.13 | 5.6 | nil |
| Polymer 1 (100) | PAG1 (2) | Tributylamine (0.1) | DRI2 | 22 | 0.13 | 5.1 | nil |

TABLE 3

| Polymer (pbw) | Photoacid generator (pbw) | Basic compound (pbw) | Dissolution inhibitor (pbw) | Sensitivity, mJ/cm2 | Resolution, μm | Line edge roughness, nm | Residues in space |
|---|---|---|---|---|---|---|---|
| Comparative Polymer 1 (100) | PAG1 (2) | Tributylamine (0.1) | — | 38 | 0.14 | 9.5 | large amount, space filled with residues |
| Comparative Polymer 2 (100) | PAG1 (2) | Tributylamine (0.1) | — | 28 | 0.14 | 8.8 | small amount, discrete residues in space |

Japanese Patent Application No. 2002-130326 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising as a base resin a polymer obtained by copolymerization of a silicon-containing monomer with a polar monomer having a LogP or cLogP value of up to 0.6 and having a structure of the general formula (1) or (2):

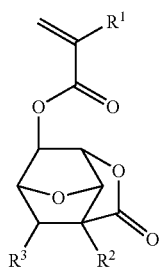
(1)

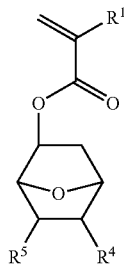
(2)

wherein $R^1$ which may be the same or different is hydrogen, methyl or cyano group, $R^2$ is hydrogen, methyl or cyano group, $R^3$ is hydrogen or ester group, $R^4$ and $R^5$ each are hydrogen, ester group or lactone ring-containing group, or $R^4$ and $R^5$, taken together, may form a ring with the carbon atoms to which they are attached, which ring may contain an ether, ester, carbonate or carboxylic anhydride as a partial structure.

2. The resist composition of claim 1 wherein recurring units derived from the silicon-containing monomer have the general formula (3):

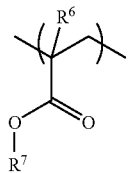
(3)

wherein $R^6$ is hydrogen or methyl and $R^7$ is a silicon-containing group selected from the general formulae (4) to (9):

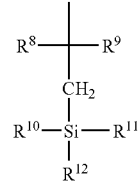
(4)

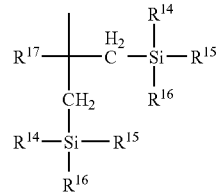
(5)

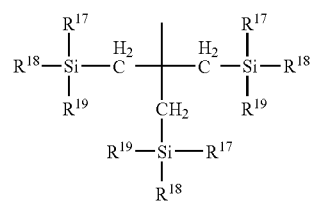
(6)

wherein $R^8$, $R^9$ and $R^{13}$ each are hydrogen or a straight, branched or cyclic $C_{1-10}$ alkyl group, or $R^8$ and $R^9$, taken together, may form an aliphatic carbon ring of 3 to 8 carbon atoms with the carbon atom to which they are attached, $R^{10}$, $R^{11}$, $R^{12}$, $R^{13}$, $R^{14}$, $R^{15}$, $R^{16}$, $R^{17}$, $R^{18}$ and $R^{19}$ each are a straight, branched or cyclic $C_{1-10}$ alkyl group, a $C_{6-10}$ aryl group, a trialkylsilyl group, a trialkylsiloxy group or a group of the following formula:

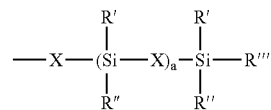

wherein X is a single bond, oxygen atom or $C_{1-6}$ alkylene group, "a" is an integer of 1 to 10, R', R" and R''' each are a straight, branched or cyclic $C_{1-10}$ alkyl group or trialkylsilyl group, two of $R^{10}$, $R^{11}$ and $R^{12}$, two of $R^{14}$, $R^{15}$ and $R^{16}$, and two of $R^{17}$, $R^{18}$ and $R^{19}$ may bond together to form a ring of the following formula with the silicon atom to which they are attached,

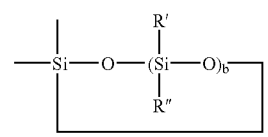

wherein R' and R" are as defined above, and b is an integer of 2 to 9,

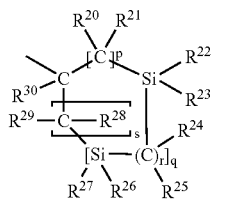

(7)

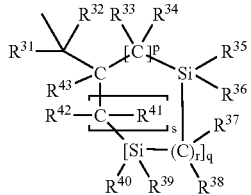

(8)

wherein $R^{30}$, $R^{31}$ and $R^{32}$ each are a straight, branched or cyclic $C_{1-20}$ alkyl group, $R^{20}$, $R^{21}$, $R^{24}$, $R^{25}$, $R^{28}$, $R^{29}$, $R^{30}$, $R^{34}$, $R^{37}$, $R^{38}$, $R^{41}$ and $R^{42}$ each are hydrogen or a straight, branched or cyclic $C_{1-20}$ alkyl group, $R^{22}$, $R^{23}$, $R^{26}$, $R^{27}$, $R^{35}$, $R^{36}$, $R^{39}$ and $R^{40}$ each are hydrogen, a straight, branched or cyclic $C_{1-20}$ alkyl group, fluorinated $C_{1-20}$ alkyl group, or $C_{6-20}$ aryl group, p, q, r and s each are an integer of 0 to 10, and $1 \leq p+q+s \leq 20$,

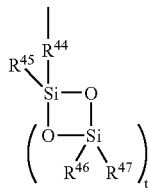

(9)

wherein $R^{44}$ is a $C_{2-4}$ alkylene group, $R^{45}$, $R^{46}$ and each are a straight, branched or cyclic $C_{1-10}$ alkyl group or $C_{6-10}$ aryl group, and t is an integer of 2 to 10.

3. A chemically amplified positive resist composition comprising
   (A) the polymer as set forth in claim 1,
   (B) a photoacid generator, and
   (C) an organic solvent.

4. A chemically amplified positive resist composition comprising
   (A) the polymer as set forth in claim 1,
   (B) a photoacid generator, (
   C) an organic solvent, and
   (D) a dissolution inhibitor.

5. The resist composition of claim 3, further comprising (E) a basic compound.

6. A process for forming a resist pattern comprising the steps of:
   applying the resist composition of claim 1 onto a substrate to form a coating,
   heat treating the coating and then exposing it to high-energy radiation having a wavelength of up to 300 nm or electron beam through a photomask, and
   optionally heat treating the exposed coating and developing it with a developer.

7. The pattern forming process of claim 6 wherein the substrate bears thereon an underlay on which the coating of the resist composition is formed, said process further comprising the step of treating the underlay by an etching process including oxygen plasma etching, after the resist pattern formation.

8. The pattern forming process of claim 6 wherein the substrate bears thereon an underlay on which the coating of the resist composition is formed, said process further comprising the step of treating the underlay by etching with a halogen gas containing chlorine or bromine, after the resist pattern formation.

9. A resist composition comprising as a base resin a polymer obtained by copolymerization of a silicon-containing monomer with a polar monomer having a structure of the general formula (1) or (2):

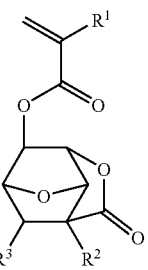

(1)

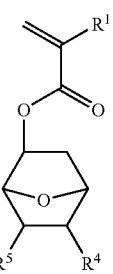

(2)

wherein $R^1$ which may be the same or different is hydrogen, methyl or cyano group, $R^2$ is hydrogen, methyl or cyano group, $R^3$ is hydrogen or ester group, $R^4$ and $R^5$ each are hydrogen, ester group or lactone ring-containing group, or $R^4$ and $R^5$, taken together, may form a ring with the carbon atoms to which they are attached, which ring may contain an ether, ester, carbonate or carboxylic anhydride as a partial structure, recurring units derived from a silicon-containing monomer having the general formula (3):

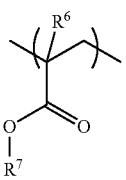

(3)

wherein $R^6$ is hydrogen or methyl and $R^7$ is a silicon-containing group selected from the general formulae (4) to (9):

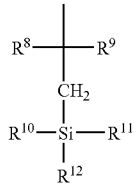
(4)

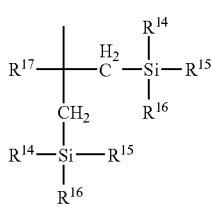
(5)

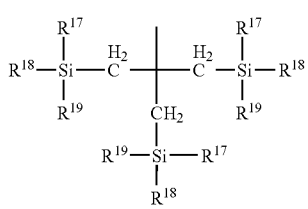
(6)

wherein $R^8$, $R^9$ and $R^{13}$ each are hydrogen or a straight, branched or cyclic $C_{1-10}$ alkyl group, or $R^8$ and $R^9$, taken together, may form an aliphatic carbon ring of 3 to 8 carbon atoms with the carbon atom to which they are attached, $R^{10}$, $R^{11}$, $R^{12}$, $R^{13}$, $R^{14}$, $R^{15}$, $R^{16}$, $R^{17}$, $R^{18}$ and R' each are a straight, branched or cyclic $C_{1-10}$ alkyl group, a $C_{6-10}$ aryl group, a trialkylsilyl group, a trialkylsiloxy group or a group of the following formula:

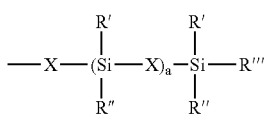

wherein X is a single bond, oxygen atom or $C_{1-6}$ alkylene group, "a" is an integer of 1 to 10, R', R" and R'" each are a straight, branched or cyclic $C_{1-10}$ alkyl group or trialkylsilyl group, two of $R^{10}$, $R^{11}$ and $R^{12}$, two of $R^{14}$, $R^{15}$ and $R^{16}$, and two of $R^{17}$, $R^{18}$ and $R^{19}$ may bond together to form a ring of the following formula with the silicon atom to which they are attached,

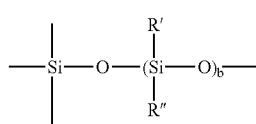

wherein R' and R" are as defined above, and b is an integer of 2 to 9,

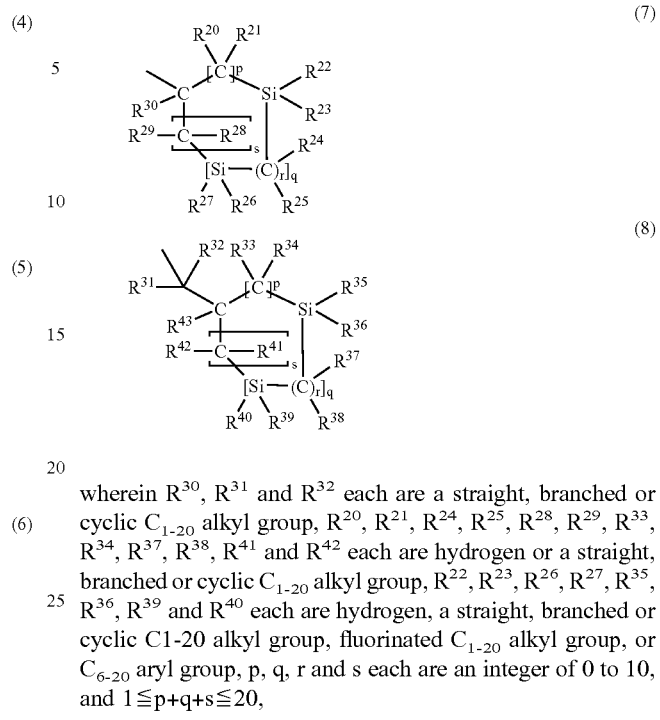

wherein $R^{30}$, $R^{31}$ and $R^{32}$ each are a straight, branched or cyclic $C_{1-20}$ alkyl group, $R^{20}$, $R^{21}$, $R^{24}$, $R^{25}$, $R^{28}$, $R^{29}$, $R^{33}$, $R^{34}$, $R^{37}$, $R^{38}$, $R^{41}$ and $R^{42}$ each are hydrogen or a straight, branched or cyclic $C_{1-20}$ alkyl group, $R^{22}$, $R^{23}$, $R^{26}$, $R^{27}$, $R^{35}$, $R^{36}$, $R^{39}$ and $R^{40}$ each are hydrogen, a straight, branched or cyclic C1-20 alkyl group, fluorinated $C_{1-20}$ alkyl group, or $C_{6-20}$ aryl group, p, q, r and s each are an integer of 0 to 10, and $1 \leq p+q+s \leq 20$,

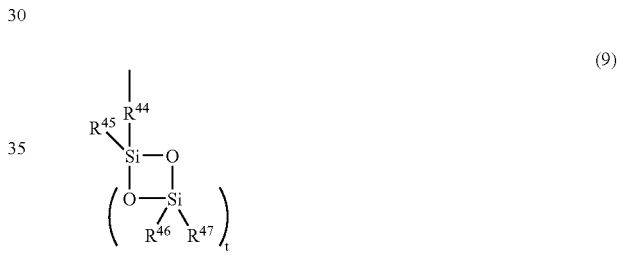

wherein $R^{44}$ is a $C_{2-4}$ alkylene group, $R^{45}$, $R^{46}$ and $R^{47}$ each are a straight, branched or cyclic $C_{1-10}$ alkyl group or $C_{6-10}$ aryl group, and t is an integer of 2 to 10.

10. The resist composition of claim 9 wherein the polymer further has hydroxystyrene copolymerized therewith.

11. A chemically amplified positive resist composition comprising (A) the polymer as set forth in claim 9, (B) a photoacid generator, and (C) an organic solvent.

12. A chemically amplified positive resist composition comprising (A) the polymer as set forth in claim 10, (B) a photo acid generator, and (C) an organic solvent.

13. The resist composition of claim 11, further comprising (E) a basic compound.

14. The resist composition of claim 12, further comprising (E) a basic compound.

15. A process for forming a resist pattern comprising the steps of:

applying the resist composition of claim 9 onto a substrate to form a coating, heat treating the coating and then exposing it to high-energy radiation having a wavelength of up to 300 nm or electron beam through a photomask, and optionally heat treating the exposed coating and developing it with a developer.

16. The pattern forming process of claim 15 wherein the substrate bears thereon an underlay on which the coating of the resist composition is formed, said process further comprising the step of treating the underlay by an etching process including oxygen plasma etching, after the resist pattern formation.

17. The pattern forming process of claim 15 wherein the substrate bears thereon an underlay on which the coating of the resist composition is formed, said process further comprising the step of treating the underlay by etching with a halogen gas containing chlorine or bromine, after the resist pattern formation.

18. The resist composition of claim 1 wherein the polymer further has hydroxystyrene copolymerized therewith.

* * * * *